United States Patent
Chen et al.

(10) Patent No.: US 11,822,902 B2
(45) Date of Patent: Nov. 21, 2023

(54) SYSTEMS AND METHODS FOR PERFORMING LOSSLESS SOURCE CODING

(71) Applicant: California Institute of Technology, Pasadena, CA (US)

(72) Inventors: Shuqing Chen, Woodland Hills, CA (US); Michelle Effros, Pasadena, CA (US); Victoria Kostina, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 17/155,001

(22) Filed: Jan. 21, 2021

(65) Prior Publication Data

US 2021/0255836 A1   Aug. 19, 2021

Related U.S. Application Data

(60) Provisional application No. 62/963,693, filed on Jan. 21, 2020.

(51) Int. Cl.
| | |
|---|---|
| *G06F 9/44* | (2018.01) |
| *G06F 9/445* | (2018.01) |
| *G06F 9/455* | (2018.01) |
| *G06F 8/30* | (2018.01) |
| *H03M 13/03* | (2006.01) |

(52) U.S. Cl.
CPC .............. *G06F 8/30* (2013.01); *H03M 13/03* (2013.01)

(58) Field of Classification Search
CPC ..... G06F 8/30; H03M 7/3057; H03M 7/6041; H03M 13/03; H03M 13/05
See application file for complete search history.

(56) References Cited

U.S. PATENT DOCUMENTS

| 10,051,333 B2* | 8/2018 | Moon ................. H03M 13/118 |
| 2010/0141489 A1* | 6/2010 | Reznik ................... H03M 7/40 341/67 |

(Continued)

FOREIGN PATENT DOCUMENTS

| CN | 101833436 A | * | 9/2010 | ......... G06F 12/0862 |
| CN | 101945263 A | * | 1/2011 | |

(Continued)

OTHER PUBLICATIONS

Stark C. Draper, Lossless Coding for Distributed Streaming Sources, 2014, pp. 1447-1474. https://ieeexplore.ieee.org/stamp/stamp.jsp?arnumber=6679247 (Year: 2014).*

(Continued)

*Primary Examiner* — Mongbao Nguyen
(74) *Attorney, Agent, or Firm* — KPPB LLP

(57) ABSTRACT

Systems and methods in accordance with various embodiments of the invention perform lossless source coding. Nested code structures are utilized to perform Random Access Source Coding (RASC), where the number of active encoders is initially unknown. Decoders can attempt to source decode using a number of Slepian-Wolf decoders corresponding to an estimated number of sources. Multiple source encoders are configured to receive start messages and transmit portions of codewords, selected by source encoding data from sources to remove redundancy, until an end of epoch message is received.

22 Claims, 13 Drawing Sheets

(56) References Cited

U.S. PATENT DOCUMENTS

| | | | | |
|---|---|---|---|---|
| 2014/0222964 | A1* | 8/2014 | Leong | H03M 13/373 709/219 |
| 2018/0336117 | A1* | 11/2018 | Noorzad | G06F 11/3006 |
| 2018/0352249 | A1* | 12/2018 | Boufounos | H04N 19/149 |
| 2019/0253182 | A1* | 8/2019 | Iscan | H04L 1/0013 |
| 2021/0152290 | A1* | 5/2021 | Li | H04L 1/1819 |

FOREIGN PATENT DOCUMENTS

| | | | | |
|---|---|---|---|---|
| CN | 102939730 | A * | 2/2013 | H04L 1/1635 |
| CN | 107465928 | A * | 12/2017 | H03M 7/4018 |
| WO | WO-2014160194 | A2 * | 10/2014 | G06F 21/6209 |
| WO | WO-2017134414 | A1 * | 8/2017 | H04L 1/0059 |

OTHER PUBLICATIONS

Michelle Effros, Random Access Channel Coding in the Finite Blocklength Regime, 2018, pp. 1261-1265. https://ieeexplore.ieee.org/stamp/stamp.jsp?tp=&arnumber=8437831 (Year: 2018).*

Jing Zhong, Timely Lossless Source Coding for Randomly Arriving Symbols, 2018, pp. 1-5. https://ieeexplore.ieee.org/stamp/stamp.jsp?tp=&arnumber=8613380 (Year: 2018).*

Alejandro Cohen, Efficient Data Collection Over Multiple Access Wireless Sensors Network, 2018, pp. 1-17. https://arxiv.org/pdf/1712.03314.pdf (Year: 2018).*

Jing Zhong, Timeliness in Lossless Block Coding, 2018, pp. 1-6. https://arxiv.org/pdf/1802.09167.pdf (Year: 2018).*

Wen Bo Zhang, Learning-Aided Unary Error Correction Codes for Non-Stationary and Unknown Sources, 2016, pp. 2408-2426. https://ieeexplore.ieee.org/document/7436767 (Year: 2016).*

O. Y. Bursalioglu, Joint Source-Channel Coding for Deep-Space Image Transmission using Rateless Codes, 2013, pp. 3448-3460. https://ieeexplore.ieee.org/stamp/stamp.jsp?tp=&arnumber=5743568 (Year: 2013).*

Amraoui et al., "Finite-Length Scaling for Iteratively Decoded LDPC Ensembles", IEEE Transactions on Information Theory, vol. 55, Issue 2, Feb. 2009, pp. 473-498, DOI: 10.1109/TIT.2008.2009580.

Amraoui et al., "Finite-length scaling of irregular LDPC code ensembles", IEEE Information Theory Workshop, Aug. 29-Sep. 1, 2005, pp. 6-10, DOI: 10.1109/ITW.2005.1531845.

Bennatan et al., "Design and analysis of nonbinary LDPC codes for arbitrary discrete-memoryless channels", IEEE Transactions on Information Theory, vol. 52, Issue 2, Feb. 2006, pp. 549-583, DOI: 10.1109/TIT.2005.862080.

Bennatan et al., "On the application of LDPC codes to arbitrary discrete-memoryless channels", IEEE Transactions on Information Theory, vol. 50, Issue 3, Mar. 2004, pp. 417-438, DOI: 10.1109/TIT.2004.824917.

Bentkus, "On the dependence of the Berry-Esseen bound on dimension", Journal of Statistical Planning and Inference, vol. 113, May 2003, pp. 385-402.

Berrou et al., "Near Shannon limit error-correcting coding and decoding: Turbo-codes. 1", Proceedings of ICC '93—IEEE International Conference on Communications, May 23-26, 1993, OI: 10.1109/ICC.1993.397441.

Burshtein et al., "Asymptotic enumeration methods for analyzing LDPC codes", IEEE Transactions on Information Theory, vol. 50, Issue 6, Jun. 1, 2004, pp. 1115-1131, DOI: 10.1109/TIT.2004.828064.

Chen et al., "Lossless Source Coding in the Point-to-Point, Multiple Access, and Random Access Scenarios", 2019 IEEE International Symposium on Information Theory (ISIT), Jul. 2019, pp. 1692-1696, DOI: 10.1109/ISIT.2019.8849742.

Csiszar et al., "Towards a general theory of source networks", IEEE Transactions on Information Theory, vol. 26, Issue 2, Mar. 1980, pp. 155-165, DOI: 10.1109/TIT.1980.1056166.

Davey et al., "Low-Density Parity Check Codes over GF(q)", IEEE Communications Letters, vol. 2, No. 6, Jun. 1998, pp. 165-167.

Di et al., "Finite-length analysis of low-density parity-check codes on the binary erasure channel", IEEE Transactions on Information Theory, vol. 48, No. 6, Jun. 2002, pp. 1570-1579, DOI: 10.1109/TIT.2002.1003839.

Elias, "Coding for Noisy Channels", in IRE Conv. Rec., vol. 3, Mar. 1955, pp. 37-46.

Erez et al., "The ML decoding performance of LDPC ensembles over Z/sub q/", IEEE Transactions on Information Theory, vol. 51, Issue 5, May 2005, pp. 1871-1879, DOI: 10.1109/TIT.2005.846431.

Gallager, "Information Theory and Reliable Communication", Courses and Lectures, No. 30, 1st Edition, Springer, vol. 2, Jul. 1970, 116 pgs.

Gallager, "Low-density parity-check codes", IRE Transactions on Information Theory, vol. 8, Issue 1, Jan. 1962, pp. 21-28, DOI: 10.1109/TIT.1962.1057683.

Han et al., "A new achievable rate region for the interference channel", IEEE Transactions on Information Theory, vol. IT-27, Issue 1, Jan. 1981, pp. 49-60, https://doi.org/10.1109/TIT.1981.1056307.

Huang et al., "Finite Blocklength Coding for Multiple Access Channels", Proceedings of the IEEE International Symposium on Information Theory Proceedings, Cambridge, Massachusetts, Jul. 1-6, 2012, 5 pgs.

Jaggi et al., "Universal linked multiple access source codes", Proceedings IEEE International Symposium on Information Theory, Jun. 30, 2002-Jul. 5, 2002, p. 95, DOI: 10.1109/ISIT.2002.1023367.

Kimura et al., "Weak Variable-Length Slepian-Wolf Coding With Linked Encoders for Mixed Sources", IEEE Transactions on Information Theory, vol. 50, No. 1, Feb. 2004, pp. 183-193, DOI: 10.1109/TIT.2003.821968,.

Kontoyiannis et al., "Optimal Lossless Data Compression: Non-Asymptotics and Asymptotics", IEEE Transactions on Information Theory, vol. 60, Issue 2, Feb. 2014, first published Nov. 14, 2013, pp. 777-795, DOI: 10.1109/TIT.2013.2291007.

Korolev et al., "On the Upper Bound for the Absolute Constant in the Berry-Esseen Inequality", Theory of Probability & Its Applications, vol. 54, Issue 4, pp. 638-658, 2010, 10.1137/S0040585X97984449.

Kostina et al., "Fixed-Length Lossy Compression in the Finite Blocklength Regime", IEEE Transactions on Information Theory, vol. 58, Issue 6, Jun. 2012, first published Feb. 3, 2012, pp. 3309-3338, DOI: 10.1109/TIT.2012.2186786.

Kostina et al., "Variable-length compression allowing errors", IEEE Trans. Inf. Theory, vol. 56, No. 5, May 2010, pp. 2679-2683.

Liu et al., "A new universal random coding bound for the multiple-access channel", Proceedings of 1995 IEEE International Symposium on Information Theory, Sep. 17-22, 1995, p. 442, DOI: 10.1109/ISIT.1995.550429.

McMillan, "The Basic Theorems of Information Theory", The Annals of Mathematical Statistics, vol. 24, No. 2, Jun. 1953, pp. 196-219.

Measson et al., "Maxwell Construction: The Hidden Bridge Between Iterative and Maximum a Posteriori Decoding", IEEE Transactions on Information Theory, vol. 54, Issue 12, Dec. 2008, first published Nov. 25, 2008, pp. 5277-5307, DOI: 10.1109/TIT.2008.2006466.

Mei et al., "Performance Analysis of Finite-Length LDPC Codes Over Asymmetric Memoryless Channels", IEEE Transactions on Vehicular Technology, vol. 68, Issue 11, Nov. 2019, first published Sep. 27, 2019, p. 11338-11342, DOI: 10.1109/TVT.2019.2944139.

Miller et al., "Bounds on the maximum-likelihood decoding error probability of low-density parity-check codes", IEEE Transactions on Information Theory, vol. 47, Issue 7, Nov. 2001, pp. 2696-2710, DOI: 10.1109/18.959254.

Minero et al., "Random Access: An Information-Theoretic Perspective", IEEE Transactions on Information Theory, vol. 58, No. 2, Feb. 6, 2012, pp. 909-930, arXiv:0912.3264 [cs.IT], Dec. 16, 2009.

Miyake et al., "Coding Theorems on Correlated General Sources", IEICE Transactions on Fundamentals of Electronics, Communications and Computer Sciences, vol. E78-A, No. 9, Sep. 25, 1995, pp. 1063-1070.

Nomura et al., "Second-order Slepian-Wolf coding theorems for non-mixed and mixed sources", IEEE Transactions on Information Theory, vol. 60, No. 9, Sep. 2014, pp. 5553-5572, DOI: 10.1109/TIT.2014.23.39231.

(56) References Cited

OTHER PUBLICATIONS

Oohama, "Universal coding for correlated sources with linked encoders", IEEE Transactions on Information Theory, vol. 42, Issue 3, May 1996, pp. 837-847, DOI: 10.1109/ISIT.2002.1023367.

Oohama et al., "Universal coding for the Slepian-Wolf data compression system and the strong converse theorem", IEEE Transactions on Information Theory, vol. 40, Issue 6, Nov. 1994, pp. 1908-1919, DOI: 10.1109/18.340465.

Polyanskiy, "A perspective on massive random-access", Proceedings of the IEEE International Symposium on Information Theory (ISIT), Aachen, Germany, Jun. 25-30, 2017, 5 pgs.

Polyanskiy et al., "Channel Coding Rate in the Finite Blocklength Regime", IEEE Transactions on Information Theory, vol. 56, No. 5, May 2010, pp. 2307-2359, DOI 10.1109/TIT.2010.2043769.

Polyanskiy et al., "Lecture Notes on Information Theory", MIT (6.441), UIUC (ECE 563), Yale (STAT 664), 2012-2017, 342 pgs.

Richardson et al., "Finite-length analysis of various low-density parity-check ensembles for the binary erasure channel", Proceedings IEEE International Symposium on Information Theory, Jun. 30, 2002-Jul. 5, 2002, DOI: 10.1109/ISIT.2002.1023273.

Roumy et al., "Characterization and Optimization of LDPC Codes for the 2-User Gaussian Multiple Access Channel", EURASIP Journal on Wireless Communications and Networking, vol. 2007, Article 74894, Jun. 2007, 10 pgs., DOI: 10.1155/2007/74890.

Sarvotham et al., "Variable-Rate Universal Slepian-Wolf Coding with Feedback", Conference Record of the Thirty-Ninth Asilomar Conference on Signals, Systems and Computers, Oct. 30, 2005-Nov. 2, 2005, pp. 8-12, DOI: 10.1109/ACSSC.2005.1599690.

Shannon et al., "A Mathematical Theory of Communication", The Bell System Technical Journal, vol. 27, July, Oct. 1948, 379-423, 623-656.

Sharifi et al., "LDPC Code Design for the Two-User Gaussian Multiple Access Channel", IEEE Transactions on Wireless Communications, vol. 15, Issue 4, Apr. 2016, first published Dec. 23, 2015, pp. 2833-2844, DOI: 10.1109/TWC.2015.2511749.

Shevtsova, "On the absolute constants in the Berry-Esseen-type inequalities", Doklady Mathematics, vol. 89, May 2014, pp. 378-381, https://doi.org/10.1134/S1064562414030338.

Slepian et al., "Noiseless Coding of Correlated Information Source", IEEE Transactions on Information Theory, vol. 19, No. 4, Jul. 1973. pp. 881-890, DOI: 10.1109/TIT.1973.1055037.

Szpankowski et al., "Minimum Expected Length of Fixed-to-Variable Lossless Compression Without Prefix Constraints", IEEE Transactions on Information Theory, vol. 57, No. 7, Aug. 2011, pp. 4017-4025, DOI:10.1109/TIT.2011.2145590.

Tan et al., "On the Dispersions of Three Network Information Theory Problems", IEEE Transactions on Information Theory, vol. 60, No. 2, Feb. 2014, pp. 881-903, arXiv: 1201.3901.

Yagi et al., "Coset codes for compound multiple access channels with common information", 2009 IEEE International Symposium on Information Theory, ISIT 2009, Nov. 19, 2009, pp. 1854-1858, DOI: 10.1109/ISIT.2009.5205439.

Yang et al., "New Nonasymptotic Channel Coding Theorems for Structured Codes", IEEE Transactions on Information Theory, vol. 61, No. 9, Sep. 2015, pp. 4534-4553, DOI: 10.1109/TIT.2015.2449852.

Yang et al., "Universal Multiterminal Source Coding Algorithms With Asymptotically Zero Feedback: Fixed Database Case", IEEE Transactions on Information Theory, vol. 54, Issue 12, first published Dec. 2008, Nov. 25, 2008, pp. 5575-5590, DOI: 10.1109/TIT.2008.2006449.

Yazdani et al., "Waterfall Performance Analysis of Finite-Length LDPC Codes on Symmetric Channels", IEEE Transactions on Communications, vol. 57, Issue 11, Nov. 2009, pp. 3183-3187, DOI: 10.1109/TCOMM.2009.11.070210.

Noorzad et al., "On the power of cooperation: can a little help a lot? (extended version)", in Proceedings of the IEEE International Symposium on Information Theory (ISIT), 2014, pp. 3132-3136.

* cited by examiner

SYSTEMS AND METHODS FOR PERFORMING LOSSLESS SOURCE CODING

CROSS-REFERENCE TO RELATED APPLICATIONS

The present invention claims priority to U.S. Provisional Patent Application Ser. No. 62/963,693 entitled "Lossless Source Coding In The Point-to-Point, Multiple Access, And Random Access Regimes" to Chen et al., filed Jan. 21, 2020, the disclosures of which is herein incorporated by reference in its entirety.

STATEMENT OF FEDERALLY SPONSORED RESEARCH

This invention was made with government support under Grant. No. CCF1817241 awarded by the National Science Foundation. The government has certain rights in the invention.

FIELD OF THE INVENTION

The present invention relates generally to lossless source coding and more specifically to finite blocklength lossless source coding in applications involving one or more encoder.

BACKGROUND

The information-theoretic limit in any lossless source coding scenario is the set of code sizes or rates at which a desired level of reconstruction error is achievable. Shannon's theory analyzes this fundamental limit by allowing an arbitrarily long encoding blocklength in order to obtain a vanishing error probability.

Finite-blocklength limits, which are of particular interest in delay-sensitive and computationally-constrained coding environments, allow a non-vanishing error probability and enable study of refined asymptotics of the rates achievable with encoding blocklength n. Due to their non-vanishing error probability, the resulting codes are sometimes called "almost-lossless" source codes. The term "source coding" can be used to refer to this almost-lossless coding paradigm.

In point-to-point source coding, non-asymptotic bounds and asymptotic expansions of the minimum achievable rate have been published. For example, a third-order characterization is known for an optimal code that can provide the minimum achievable rate $R^*(n, \epsilon)$ at blocklength n and error probability $\epsilon$. For a finite-alphabet, stationary, memoryless source with single-letter distribution $P_x$, entropy $H(X)$, and varentropy $V(X) > 0$, $$R^*(n, \epsilon) \approx H(X) + \sqrt{\frac{V(X)}{n}} Q^{-1}(\epsilon) - \frac{\log n}{2n}, \quad (1)$$

where $Q^{-1}(.)$ is the inverse complementary Gaussian distribution function, and any higher-order term is bounded by $$o\left(\frac{1}{n}\right).$$

For a multiple access source coding (MASC), also known as a Slepian-Wolf (SW) source coding the fundamental limit, is the set of achievable rate tuples known as the rate region. The first-order rate region for stationary, memoryless and general sources are known and Second-order asymptotic expansions of the MASC rate region for stationary, memoryless sources have also been published. However, optimal codes that can approach the fundamental limits identified by Shannon are only known for a small number of special communication scenarios.

SUMMARY OF THE INVENTION

Systems and methods in accordance with various embodiments of the invention perform lossless source coding. A variety of systems and methods are described including systems and methods that are capable of performing source coding in one or more of three scenarios: point-to-point communication, multiple access communication, and random access communication. It can be shown that for point-to-point coding on stationary, memoryless sources, random code design with maximum likelihood decoding can achieve the same coding rate up to the third-order as an optimal code.

Systems and methods in accordance with many embodiments of the invention are capable of performing Multiple Access Source Coding (MASC) utilizing a decoder such as (but not limited to) a decoder formed by a number of stand alone Slepian Wolf decoders to decode k users by choosing the jointly most probable source realizations consistent with the received codewords. Random access source coding (RASC) systems are also introduced and various embodiments are described in which RASC is performed for all possible encoder activity patterns. In several embodiments, a nested structure of the code is utilized to perform RASC and there is no need for the encoders to know the set of active encoders a priori. In several embodiments, the decoder can attempt to decode using a number of Slepian Wolf decoders corresponding to an estimated number of sources. In the event that the decoder is unable to successfully decode the received information, then the decoder can retry using a different estimate of the number of sources. The third-order-optimal MASC performance can be achievable even when the only information the encoders receive is the acknowledgment that tells them when to stop transmitting.

One embodiment of the random access source coding (RASC) system includes a plurality of source encoders that are each configured to receive data from one of a plurality of sources. When one of the plurality of source encoders receives data from one of the plurality of sources, then the source encoder is configured to: receive a start of epoch message; and transmit a portion of a codeword selected by encoding data from one of the plurality of sources until an end of epoch feedback message is received. In addition, the RASC system includes a receiver comprising a source decoder, where the source decoder is configured to: cause a broadcast transmitter to transmit at least one start of epoch message; receive at least one portion of a codeword transmitted by at least one of the plurality of source encoders; and when a decoding rule is satisfied, decode data from the at least one of the plurality of the source encoders based upon the received at least one portion of a codeword, and cause the broadcast transmitter to transmit an end of epoch message. In accordance with many embodiments of the invention, source encoders and/or decoders may include at least one processor. The processor which may be configured to process input data according to instructions stored in memory. The memory may be a tangible, non-transitory, computer-readable medium configured to store instructions that are executable by the processor. For example, the memory may be data storage that can be loaded with software code that is executable by the processor to achieve certain functions including but not limited to source encoding and source decoding.

In a further embodiment, the source decoder is configured to determine whether the decoding rule is satisfied at each of a predetermined set of decode times and transmit a feedback message; each of the plurality of source encoders is configured to receive feedback messages at the predetermined set of potential decoding times; and each of the predetermined set of decode times corresponds to one of a plurality of blocklengths of the codeword selected by encoding data from one of the plurality of sources.

In another embodiment, a first of the plurality of blocklengths of the codeword selected by encoding data from one of the plurality of sources forms a first blocklength code; a second of the plurality of blocklengths of the codeword selected by encoding data from one of the plurality of sources forms a second blocklength code; and the first blocklength code forms a prefix for the second blocklength code.

In a still further embodiment, a third of the plurality of blocklengths of the codeword selected by encoding data from one of the plurality of sources forms a third blocklength code; and the second blocklength code forms a prefix for the third blocklength code.

In still another embodiment, each source encoder is configured to select codewords from a codebook.

In a yet further embodiment, the data received from the plurality of sources is dependent.

In yet another embodiment, the broadcast transmitter sends a negative acknowledgement feedback message when the decoding rule is not satisfied at a predetermined decode time.

In a further embodiment again, each source encoder that is transmitting is configured to transmit an additional portion of the codeword selected by encoding data from one of the plurality of sources in response to receipt of a negative acknowledgement feedback message.

A source encoding system in accordance with another embodiment again includes: a receiver configured to receive a start of epoch message; and a source encoder configured to transmit a portion of a codeword selected by encoding data from a source until an end of epoch feedback message is received.

In a further additional embodiment, each of the plurality of source encoders is configured to receive feedback messages at each of a predetermined set of decode times; and each of the predetermined set of decode times corresponds to one of a plurality of blocklengths of the codeword selected by encoding data from the source.

In another additional embodiment, a first of the plurality of blocklengths of the codeword selected by encoding data from the source forms a first blocklength code; a second of the plurality of blocklengths of the codeword, selected by encoding data from the source forms a second blocklength code; and the first blocklength code forms a prefix for the second blocklength code.

In a still yet further embodiment, a third of the plurality of blocklengths of the codeword selected by encoding data from the source forms a third blocklength code; and the second blocklength code forms a prefix for the third blocklength code.

In still yet another embodiment, the source encoder is configured to transmit an additional portion of the codeword selected by encoding data from the source in response to receipt of a negative acknowledgement feedback message.

In a still further embodiment again, the data received from the plurality of sources is dependent.

A receiver system in accordance with still another embodiment again, includes: a source decoder configured using a codebook; a transmitter configured to transmit at least one start of epoch message; and a receiver configured to receive at least one portion of a codeword. In addition, the source decoder is further configured to determine when a decoding rule is satisfied, and when the decoding rule is satisfied: decode at least one message based upon the received at least one portion of a codeword using the codebook; and cause the transmitter to transmit an end of epoch message.

In a still further additional embodiment, the source decoder is configured to determine whether the decoding rule is satisfied at each of a predetermined set of decode times and transmit a feedback message; and each of the predetermined set of decode times corresponds to one of a plurality of blocklengths of the codeword.

In a yet further embodiment again, a first of the plurality of blocklengths of the codeword forms a first blocklength code; a second of the plurality of blocklengths of the codeword forms a second blocklength code; and the first blocklength code forms a prefix for the second blocklength code.

In yet another embodiment again, a third of the plurality of blocklengths of the codeword forms a third blocklength code; and the second blocklength code forms a prefix for the third blocklength code.

In a yet further additional embodiment, the data received from the plurality of sources is dependent.

In yet another additional embodiment, the broadcast transmitter sends a negative acknowledgement feedback message when the decoding rule is not satisfied at a predetermined decode time.

DETAILED DESCRIPTION

Figure 1:
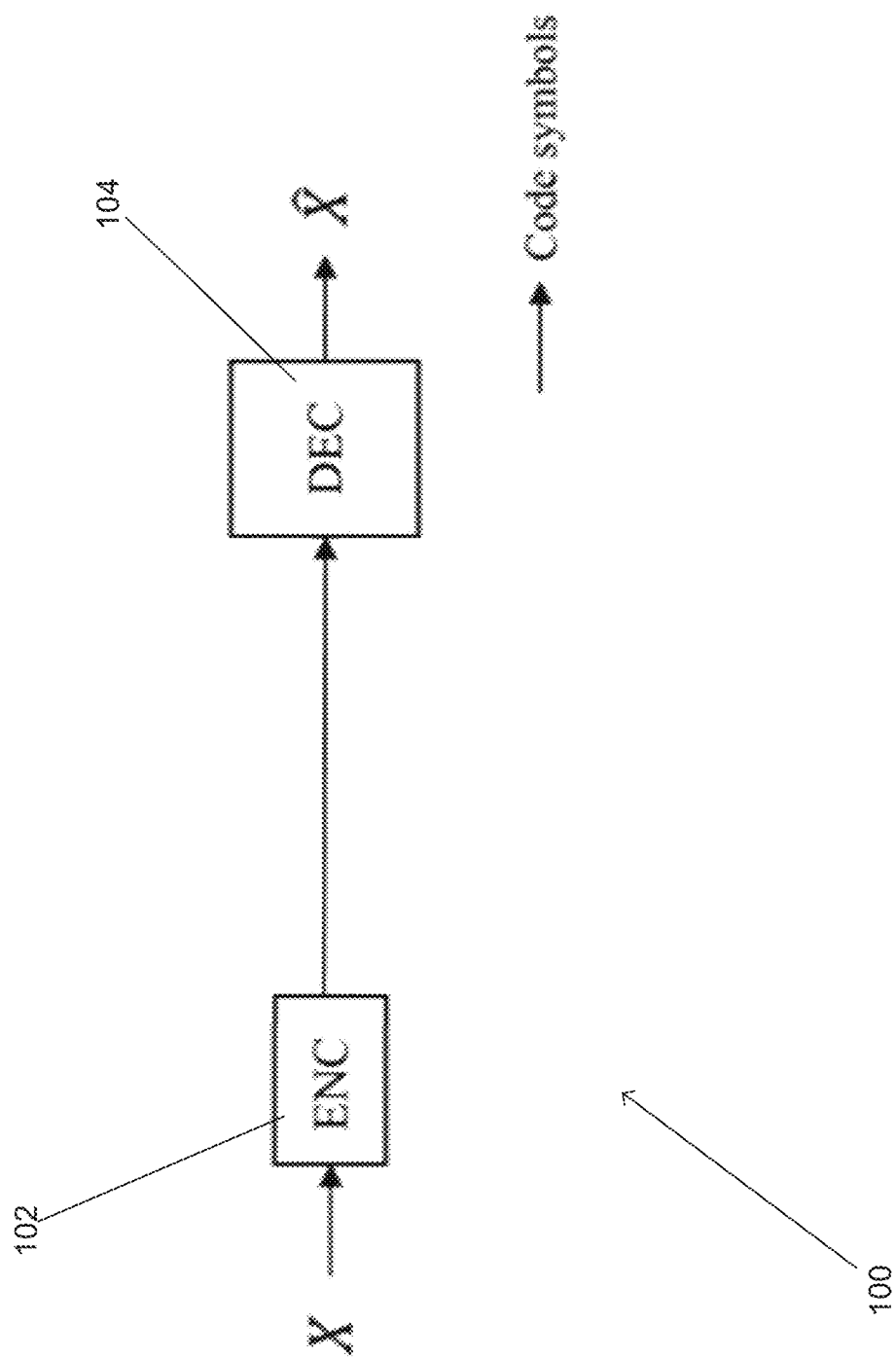
FIG. 1 is a schematic diagram illustrating a point-to-point coding system in accordance with an embodiment of the invention.

Turning now to the drawings, systems and methods for performing source coding using random codes in accordance with various embodiments of the invention are illustrated. In several embodiments, codes are utilized that can be characterized in that they can achieve performance similar to an optimal code in source coding applications involving point-to-point communication between an encoder and a decoder. In a number of embodiments, linear random codes are employed and achieve performance similar to an optimal code in source coding applications involving point-to-point communications. In several embodiments, any of a number of different types of decoders can be utilized to perform decoding including (but not limited to) maximum likelihood decoders and/or threshold decoders.

In point-to-point source coding, the encoder maps a discrete random variable X defined on finite or countably infinite alphabet X into a message from codebook [M]. The decoder reconstructs X from the compressed description. A random code is one in which each code word in the codebook [M] has a finite length and the association between the value of X and a particular code word from codebook [M] is determined randomly. In this way, the encoder need not possess any information regarding the distribution of X to encode the source. Random codes are typically sub-optimal, but random codes utilized in accordance with many embodiments of the invention can be shown to have near-optimal performance when utilized for point-to-point source coding. Furthermore, the set of random codes that have near-optimal performance includes codes that can be utilized by a linear compressor. Therefore, systems and methods in accordance with a number of embodiments utilize one of a set of linear random codes that are capable of achieving near-optimal performance. In certain embodiments, random code are utilized in combination with a maximum likelihood decoder. In a number of embodiments, random code are utilized in combination with a threshold decoder. As can readily be appreciated, the use of a threshold decoder will typically involve a requirement to operate at a higher rate than a system that relies upon use of a maximum likelihood decoder.

Systems and methods in accordance with certain embodiments of the invention perform multiple access source coding (MASC) using random codes. In several embodiments, the MASC process employs limited feedback and/or cooperation feedback. In several embodiments, MASC involves uses of a maximum likelihood decoder that chooses the jointly most probable source realizations consistent with received codewords. Where rate points converge to a non-corner point on the asymptotic sum-rate boundary, systems and methods in accordance with embodiments of the invention can be shown to not compromise the performance in lossless data compression up to the third-order term despite each encoder performing separate encoding. For independent sources, it is shown that there are no non-corner points, and MASC separate encoding incurs a positive penalty in the second-order term relative to joint encoding with a point-to-point code. When two sources have the same marginals, this penalty equals the penalty for using two independent blocklength-n codes rather than a single blocklength-2n point-to-point code for encoding 2n samples.

While a MASC assumes a fixed, known collection of encoders, the set of transmitters communicating with a given access point in applications like sensor networks, the internet of things, and random access communication may be unknown or time-varying. To address these scenarios, a new application of source coding is introduced which can be referred to as random access source coding (RASC). RASC extends MASC to scenarios where some encoders are inactive, and the decoder seeks to reliably reconstruct the sources associated with the active encoders assuming that the set of active encoders is unknown a priori.

Systems and methods in accordance with several embodiments of the invention perform RASC using rateless encoders that transmit codewords symbol by symbol until a receiver sends a message telling them to stop. Unlike typical rateless codes, which allow arbitrary decoding times the codes utilized in accordance with many embodiments of the invention possess a small set of decoding times. A single-bit feedback from the decoder to all encoders at each potential decoding time can provide the encoders with feedback concerning whether or not to continue transmitting.

In a number of embodiments, a single random code is utilized to perform RASC that is characterized in that it is a single code that simultaneously achieves, for every possible set of active encoders, the third-order-optimal MASC performance for the active source set. Since traditional random coding arguments do not guarantee the existence of a single deterministic code that meets multiple independent constraints, prior code designs for multiple-constraint scenarios typically employ a family of codes indexed using common randomness shared by all communicators. Systems and methods in accordance with many embodiments of the invention employ an alternative approach that utilizes a single deterministic code. As can readily be appreciated, for stationary, memoryless, permutation-invariant sources, employing identical encoders at all transmitters can reduce RASC design complexity.

While much of the discussion that follows relates to source coding, the hypothesis testing techniques described herein can be useful in many applications including (but not limited to) testing components (e.g., finding positive cases in pooled coronavirus tests, defective components in a factory). In the discussion below, hypothesis testing is used as a tool for analyzing the performance of various codes, but decoders in accordance with many embodiments of the invention can apply a type of composite hypothesis test that compares the possible decoder outputs as hypotheses of the form "the encoded message is 'a'" against the composite hypothesis "the encoded message is one of 'b', 'c', . . . , 'z'." Accordingly, the hypothesis testing techniques described herein can be utilized in any of a variety of applications including (but not limited to) the applications specifically described herein. Systems and methods for performing source coding in accordance with various embodiments of the invention are discussed further below.

Point-to-Point Random Source Coding

A compression system 100 that employs point-to-point random source coding in accordance with an embodiment of the invention is illustrated in FIG. 1. An (M, $\epsilon$) code for a random variable X with discrete alphabet X can be implemented by an encoder 102 employing an encoding function f: X→[M] and a decoder 104 employing a decoding function g: [M]→X with error probability $\mathbb{P}[g(f(X))\neq X]\leq \epsilon$.

In the illustrated embodiment, an (n, M, $\epsilon$) block point-to-point source code is utilized, which is an (M, $\epsilon$) code defined for a random vector $X^n$ with discrete vector alphabet $\mathcal{X}^n$. The minimum code size M*(n, $\epsilon$) and rate R*(n, $\epsilon$) achievable at blocklength n and error probability $\epsilon$ for the code are $$M^*(n, \epsilon) \stackrel{\Delta}{=} \min\{M : \exists (n, M, \epsilon) \text{ code}\} \quad (2)$$

$$R^*(n, \epsilon) \stackrel{\Delta}{=} \frac{1}{n} \log M^*(n, \epsilon). \quad (3)$$

Shannon's source coding theorem describes the fundamental limit on the asymptotic performance for lossless source coding on a stationary, memoryless source, giving $$\lim_{n\to\infty} R^*(n, \epsilon) = H(X), \quad \forall \epsilon \in (0, 1). \quad (4)$$

Optimal codes that can approach the fundamental limits identified by Shannon are only known for a small number of special communication scenarios. Consequently, systems and methods in accordance with many embodiments of the invention utilize random codes that have been determined to achieve comparable performance to optimal codes in point-to-point source coding applications. Rates that can be achieved in point-to-point source coding using random codes in accordance with various embodiments of the invention are discussed further below.

Rates Achievable in Point-to-Point Source Coding Using Random Codes

Achievability results that are based on Shannon's random coding argument are important because use of a random code does not require knowledge of the optimal code, which is available only in a few special communication scenarios. The following random coding achievability bound can be obtained by assigning source realizations to codewords independently and uniformly at random. The threshold decoder decodes to $x \in \mathcal{X}$ if and only if x is a unique source realization that (i) is compatible with the observed codeword under the given (random) code design, and (ii) has information i(x) below log M−$\gamma$.

It can be shown that there exists an (M, $\epsilon$) code for discrete random variable X such that $$\epsilon \leq \mathbb{P}[i(X) > \log M - \gamma] + \exp(-\gamma), \forall \gamma > 0. \quad (5)$$

Particularizing (5) to a stationary, memoryless source with single-letter distribution $P_x$ satisfying V(X)>0 and T(X)<∞, choosing log M and $\gamma$ optimally, and applying the Berry-Esseen inequality gives $$R^*(n, \epsilon) \leq H(X) + \sqrt{\frac{V(X)}{n}} Q^{-1}(\epsilon) - \frac{\log n}{2n} + O\left(\frac{1}{n}\right). \quad (6)$$

Since (6) exceeds the rate bounds for optimal codes by $$+\frac{\log n}{n}$$

in the third-order term, a question arises as to whether random code design, threshold decoding, or both yield third-order performance penalties. Accordingly, a new random coding bound is derived using a maximum likelihood decoder; this result demonstrates that random coding suffices to achieve the third-order optimal performance for a stationary, memoryless source.

Random code design can be used to derive two new non-asymptotic achievability bounds for point-to-point source coding. These results can be referred to as the dependence testing (DT) bound and the random coding union (RCU) bound.

The Dependence Testing Bound

The DT bound states that, given a discrete random variable X, there exists an (M, $\epsilon$) code with a threshold decoder for which $$\epsilon \leq \mathbb{E}[\exp\{-[\log M - i(X)]|_+\}]. \quad (7)$$

The DT bound provides a bound on the random coding performance of a threshold decoder with threshold log $\gamma$ as $$\epsilon \leq \mathbb{P}[i(X) > \log \gamma] + \frac{1}{M}\mathbb{U}[i(X) \leq \log \gamma], \quad (8)$$

where $\mathbb{U}[.]$ denotes a mass with respect to the counting measure $U_x$ on $\mathcal{X}$, which assigns unit weight to each $x \in \mathcal{X}$.

The right-hand side of (8) can be shown to equal $$\frac{M+1}{M}$$

times the minimum measure of the error event in a Bayesian binary hypothesis test between $P_x$ with a priori probability $$\frac{M}{M+1}$$

and $U_x$ with a priori probability $$\frac{1}{M+1}.$$

This error measure can be minimized by a test that compares the log likelihood ratio $$\log \frac{U_X(X)}{P_X(X)}$$

to the log ratio of a priori probabilities $$\log \frac{M/(M+1)}{1/(M+1)},$$

giving
 $H_0$: $P_x$, selected if i(X)$\leq$log M
 $H_1$: $U_x$, selected if i(X)>log M.

Taking $\gamma$=M minimizes the right-hand side of (8), which implies that the DT bound is the tightest possible bound for random coding with threshold decoding.

Particularizing the DT bound to a stationary, memoryless source with a single-letter distribution $P_x$ satisfying V(X)>0 and $T(X)<\infty$ and invoking the Berry-Esseen inequality, an asymptotic expansion can be obtained $$R^*(n, \epsilon) \le H(X) + \sqrt{\frac{V(X)}{n}} Q^{-1}(\epsilon) + O\left(\frac{1}{n}\right). \quad (9)$$

Unfortunately, (9) is sub-optimal in its third-order term. Thus, random code design with threshold-based decoding fails to achieve the optimal third-order performance. Despite the sub-optimal performance of utilizing random codes with a threshold-based decoder, the use of threshold-based decoding can significantly reduce computational complexity compared to several categories of decoders including (but not limited to) maximum likelihood decoders. Furthermore, the result with respect to random codes suggest that many practically implementable codes including (but not limited to) linear codes can also achieve acceptable levels of performance and/or performance approaching the performance of optimal codes. Accordingly, systems and methods in accordance with various embodiments of the invention can utilize any decoder (including threshold-based decoders) as appropriate to the requirements of specific applications.

The Random Coding Union Bound

The RCU bound employs random code design and maximum likelihood decoding. The RCU bound states that, given a discrete random variable X, there exists an (M, $\epsilon$) code with a maximum likelihood decoder for which $$\epsilon \le \mathbb{E}\left[\min\left\{1, \frac{1}{M}\mathbb{E}[\exp(i(\overline{X}))\mathbb{1}\{i(\overline{X}) \le i(X)\}|X]\right\}\right], \quad (10)$$

where $P_{X\overline{X}}(a, b) = P_x(a)P_x(b)$ for all $a, b \in X$.

The same RCU bound is obtained by randomizing only over linear encoding maps. Thus, there is no loss in performance when restricting to linear compressors.

The RCU bound can be shown to recover the first three terms of the achievability result for an optimal code. Thus, the sub-optimal third-order terms in (6) and (9) result from the sub-optimal decoder rather than the random encoder design. This is important since optimal codes are not available for scenarios like MASC, which is discussed below.

The RCU bound focuses on a stationary, memoryless source with single-letter distribution $P_x$ satisfying $$V(X) > 0 \quad (11)$$

$$T(X) < \infty. \quad (12)$$

Define constants $$B \triangleq C_0 \frac{T(X)}{V(X)^{3/2}} \quad (13)$$

$$C \triangleq 2\left(\frac{\log 2}{\sqrt{2\pi V(X)}} + 2B(X)\right), \quad (14)$$

where $C_0$ is the absolute constant in the Berry-Esseen inequality for i.i.d. random variables.

The following demonstrates that third-order-optimal achievability is possible via random coding of a stationary, memoryless source satisfying the conditions in (11) and (12). For all $0 < \epsilon < 1$.

$$R^*(n, \epsilon) \le H(X) + \sqrt{\frac{V(X)}{n}} Q^{-1}(\epsilon) - \frac{\log n}{2n} + \xi(n), \quad (15)$$

where $$\xi(n) = O\left(\frac{1}{n}\right)$$

is bounded more precisely as follows.

1) For all $$0 < \epsilon \le \frac{1}{2} \text{ and } n > \left(\frac{B+C}{\epsilon}\right)^2,$$

$$\xi(n) \le \frac{1}{n} \log C + \frac{1}{n} \frac{B+C}{\phi\left(\Phi^{-1}\left(\Phi(Q^{-1}(\epsilon)) + \frac{B+C}{\sqrt{n}}\right)\right)}. \quad (16)$$

2) For all $$\frac{1}{2} < \epsilon < 1 \text{ and } n > \left(\frac{B+C}{\epsilon - \frac{1}{2}}\right)^2,$$

$$\xi(n) \le \frac{1}{n} \log C + \frac{1}{n} \frac{B+C}{\phi(Q^{-1}(\epsilon))}. \quad (17)$$

Accordingly, the RCU bound demonstrates that systems and methods in accordance with various embodiments of the invention can achieve third-order optimal performance using random codes. While various systems and methods that employ random codes to perform source coding are described above with reference to the system shown in FIG. 1, encoders and decoders in accordance with many embodiments of the invention can be utilized in MASC applications and/or in the newly described RASC applications detailed below. Systems and methods that can perform MASC and/or RASC in accordance with various embodiments of the invention are discussed further below.

Multiple Access Source Coding

To simplify notation when discussing systems that are utilized to perform MASC, the following discussion focuses on MASC with two encoders. However, the definitions and results generalize to more than two encoders. Accordingly, it should be readily appreciated that systems and methods in accordance with many embodiments of the invention can utilize two or more sources and/or two or more decoders (e.g., Slepian Wolf decoders) as appropriate to the requirements of specific applications. In MASC, also known as a Slepian-Wolf source coding, independent encoders compress a pair of random variables $(X_1, X_2)$ with discrete alphabets $X_1$ and $X_2$. Encoder i, i∈[2], observes only $X_i$, which it maps to a codeword in $[M_i]$; a single decoder jointly decodes the pair of codewords to reconstruct $(X_1, X_2)$. Codes can be defined for abstract random objects and then particularized to random objects that live in an alphabet endowed with a Cartesian product structure.

By way of definition, an $(M_1, M_2, \epsilon)$ MASC for random variables $(X_1, X_2)$ with discrete alphabets $X_1$ and $X_2$ includes two encoding functions $f_1: X_1 \rightarrow [M_1]$ and $f_2: X_2 \rightarrow [M_2]$ and a decoding function, $g: [M_1] \times [M_2] \rightarrow X_1 \times X_2$ with error probability $$\mathbb{P}\ [g(f_1(X_1), f_2(X_2)) \neq (X_1, X_2)] \leq \epsilon. \quad (18)$$

In block coding, encoders individually observe $X_1^n$ and $X_2^n$ drawn from distribution $P_{X_1^n X_2^n}$ on $X_1^n \times X_2^n$. An $(n, M_1, M_2, \epsilon)$ block MASC is an $(M_1, M_2, \epsilon)$ MASC for random vectors $(X_1^n, X_2^n)$ on $X_1^n \times X_2^n$. The code rate for the block MASC $R=(R_1, R_2)$ is given by $$R_1 \triangleq \frac{1}{n} \log M_1, R_2 \triangleq \frac{1}{n} \log M_2. \quad (19)$$

Rate $R=(R_1, R_2)$ is $(n, \epsilon)$-achievable if there exists an $(n, M_1, M_2, \epsilon)$ MASC with $$R_1 \leq \frac{1}{n} \log M_1 \text{ and } R_2 \leq \frac{1}{n} \log M_2.$$

The $(n, \epsilon)$-rate region $\mathscr{R}^*(n, \epsilon)$ is the closure of the set of $(n, \epsilon)$-achievable rate pairs.

While the above definitions can apply to arbitrary discrete random variables $(X_{1i}, X_{2i})$, $i=1, 2, \ldots$, with transition probability kernels $P_{(X_1 X_2)_i | (X_1 X_2)^{i-1}}$, the asymptotic analysis discussed below focuses on stationary, memoryless sources, where $P_{(X_1 X_2)_i | (X_1 X_2)^{i-1}} = P_{X_1 X_2}$ for all $i=1, 2, \ldots$.

For stationary, memoryless sources with rate $R=(R_1, R_2)$ and distribution $P_{X_1 X_2}$, the following can be defined $$\overline{R} \triangleq \begin{bmatrix} R_1 \\ R_2 \\ R_1 + R_2 \end{bmatrix}, \overline{H} \triangleq \begin{bmatrix} H(X_1 | X_2) \\ H(X_2 | X_1) \\ H(X_1, X_2) \end{bmatrix}. \quad (20)$$

It can be proven that if $(X_1^n, X_2^n)$ are stationary and memoryless, then for every $\epsilon \in (0,1)$.

$$\lim_{n \to \infty} \mathcal{R}^*(n, \epsilon) = \{(R_1, R_2) : R_1 \geq H(X_1 | X_2) \quad (21)$$
$$R_2 \geq H(X_2 | X_1),$$
$$R_1 + R_2 \geq H(X_1, X_2)\}$$

(i.e., the strong converse holds). This region can be referred to as the asymptotic MASC rate region. While the above result is presented with respect to stationary and memoryless sources, systems and methods in accordance with various embodiments of the invention can be utilized with any of a variety of different, sources as appropriate to the requirements of specific applications.

Development of systems and methods for use in the MASC in accordance with various embodiments of the invention involved development of a MASC RCU bound, extending the RCU bound introduced above to the multiple-encoder case.

Given discrete random variables $(X_1, X_2)$, there exists an $(M_1, M_2, \epsilon)$ MASC with $$\epsilon \leq \mathbb{E}[\min\{1, A_1 + A_2 + A_{12}\}] \quad (22)$$

where $$A_1 \triangleq \frac{1}{M_1} \mathbb{E}\left[\exp(i(\overline{X}'_1 | X_2))\right] \quad (23)$$
$$1\{i(\overline{X}'_1 | X_2) \leq i(X_1 | X_2)\} | X_1, X_2]$$

$$A_2 \triangleq \frac{1}{M_2} \mathbb{E}\left[\exp(i(\overline{X}'_2 | X_1))\right] \quad (24)$$
$$1\{i(\overline{X}'_2 | X_1) \leq i(X_2 | X_1)\} | X_1, X_2]$$

$$A_{12} \triangleq \frac{1}{M_1 M_2} \mathbb{E}\left[\exp(i(\overline{X}_1, \overline{X}_2))\right] \quad (25)$$
$$1\{i(\overline{X}_1, \overline{X}_2) \leq i(X_1, X_2)\} | X_1, X_2]$$

$$P_{X_1 X_2 \overline{X}_1 \overline{X}_2 \overline{X}'_1 \overline{X}'_2}(a, b, \overline{a}, \overline{b}, \overline{a}', \overline{b}') = \quad (26)$$
$$P_{X_1 X_2}(a, b) P_{X_1 X_2}(\overline{a}, \overline{b}) P_{X_1 | X_2}(\overline{a}' | b) P_{X_2 | X_1}(\overline{b}' | a).$$

Figure 2A:
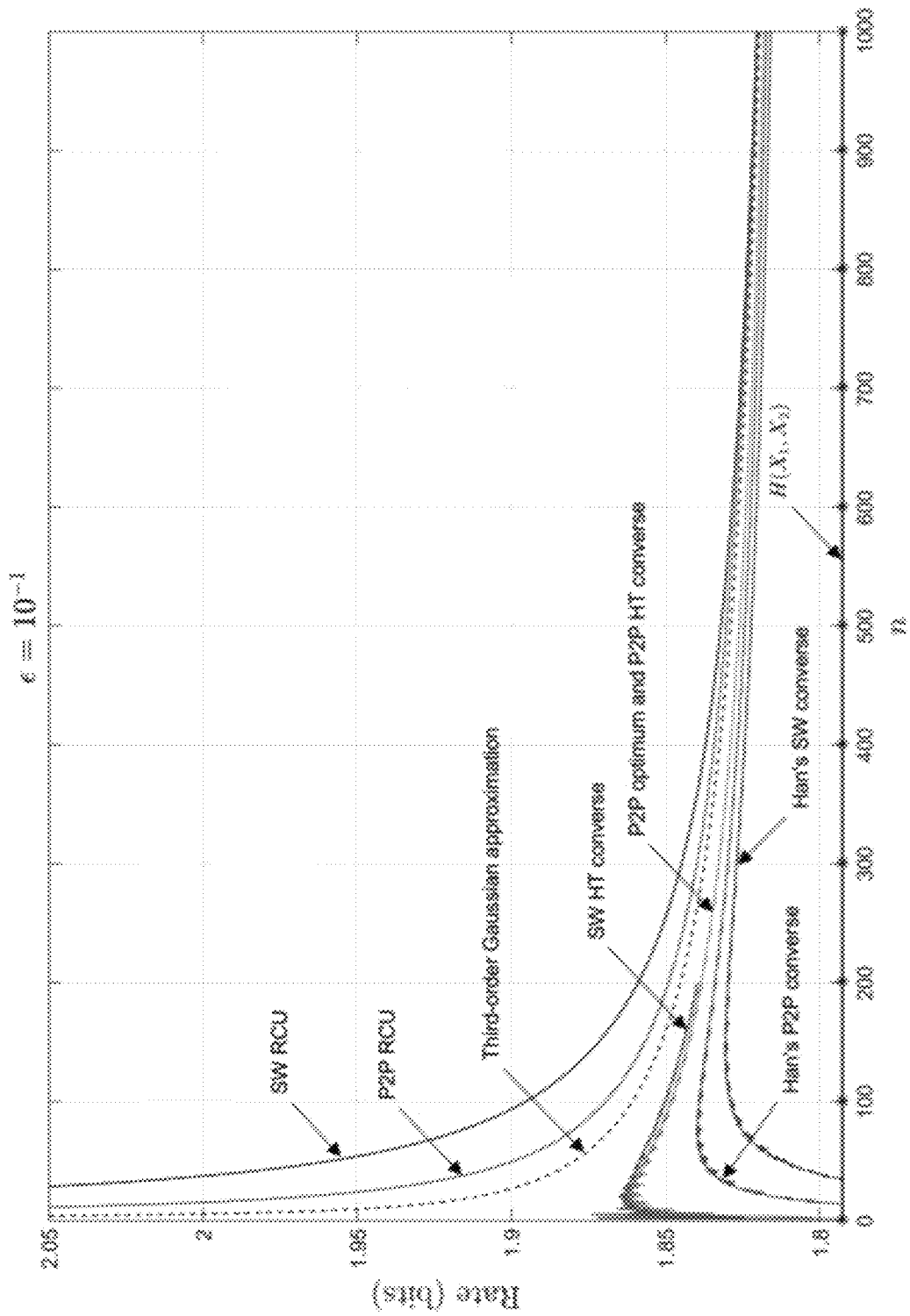
FIGS. 2A and 2B are plots that illustrate the rate-blocklength trade-offs at $\epsilon=10^{-1}$ (FIG. 2A) and $\epsilon=10^{-3}$ (FIG. 2B) for a pair of binary, stationary, memoryless sources.
Figure 2B:
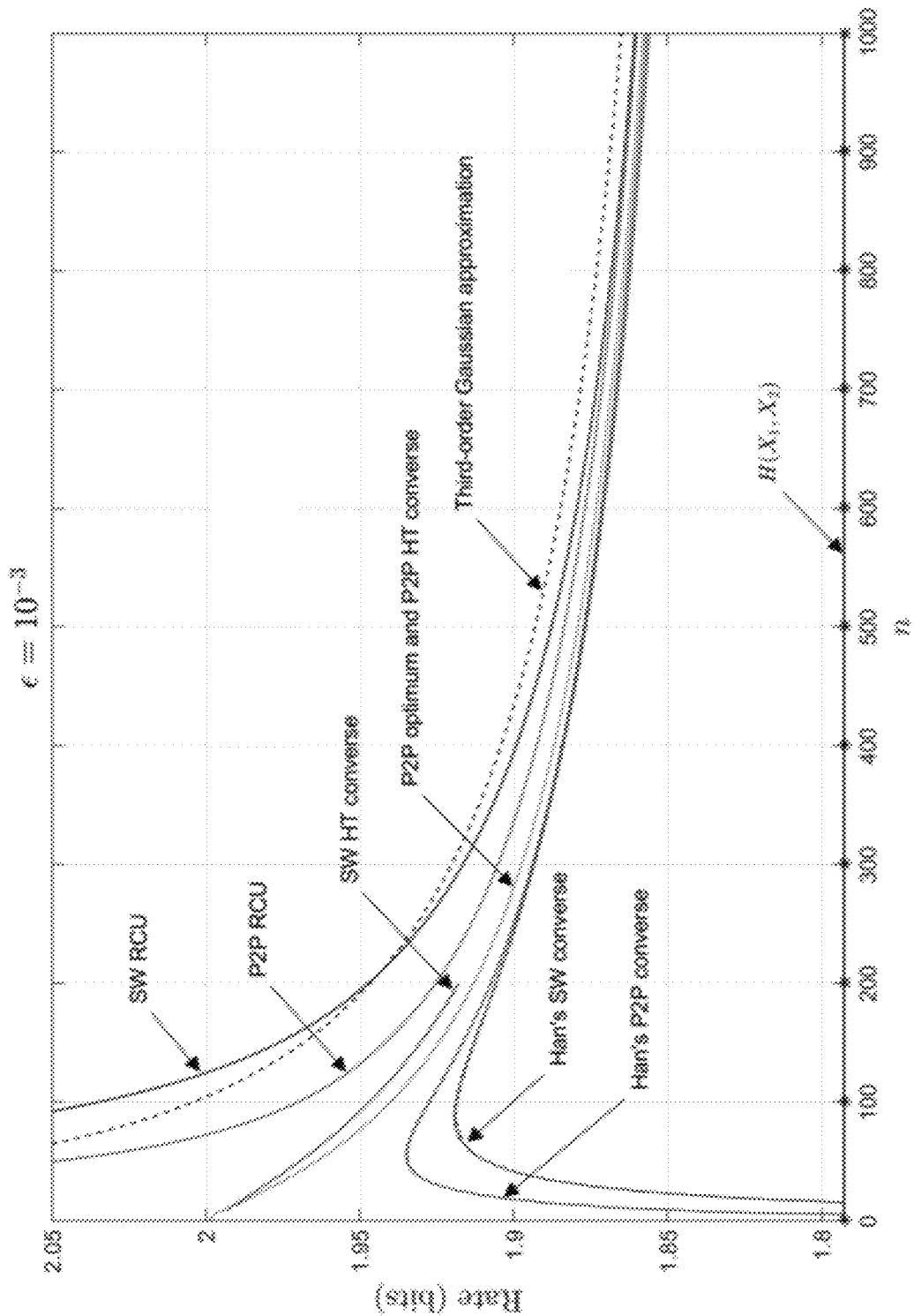

FIGS. 2A and 2B plots the point-to-point and MASC RCU bounds. Rate-blocklength trade-offs at $\epsilon=10^{-1}$ (FIG. 2A) and $\epsilon=10^{-3}$ (FIG. 2B) for a pair of binary, stationary, memoryless sources with joint, distribution $p_{X_1 X_2}(0, 0)=\frac{1}{2}$, $p_{X_1 X_2}(0, 1)=p_{X_1 X_2}(1, 0)=p_{X_1 X_2}(1, 1)=\frac{1}{6}$ are shown. The plot labelled point-to-point (P2P) hypothesis testing (HT) converse coincides with the optimum $R^*(n, \epsilon)$.

Asymptotics: Third-Order MASC Rate Region

The following third-order asymptotic characterization of the MASC rate region for stationary, memoryless sources closes the $$O\left(\frac{\log n}{n}\right)$$

gap between previous published bounds based upon second order characterization of the MASC rate-region for finite-alphabet stationary, memoryless sources in terms of the asymptotic rate region and the entropy dispersion matrix.

In order to develop a third-order asymptotic characterization, memoryless sources with single-letter joint distribution $P_{X_1 X_2}$ were considered for which $$V(X_1, X_2) \succ 0, \mathbb{E}[V_c(X_1 | X_2)] \succ 0, \mathbb{E}[V_c(X_2 | X_1)] \succ 0, \quad (27)$$

$$T(X_1, X_2) < \infty, T(X_1 | X_2) < \infty, T(X_2 | X_1) < \infty, \quad (28)$$

$$\mathbb{E}[T_c^2(X_1 | X_2)] < \infty, \mathbb{E}[T_c^2(X_2 | X_1)] < \infty. \quad (29)$$

When (27) holds, rank$(V) \geq 1$ (in fact, the weaker condition $V(X_1 | X_2) > 0$, $V(X_2 | X_1) > 0$, $V(X_1, X_2) > 0$ suffices). Assumption (28) is also satisfied automatically if the alphabets $X_1$ and $X_2$ are finite.

The following set can be defined $$\overline{\mathscr{R}}^*(n, \epsilon) \triangleq \left\{ \overline{R} \in \mathbb{R}^3 : \overline{R} = \overline{H} + \frac{\mathscr{Q}_{inv}(V, \epsilon)}{\sqrt{n}} - \frac{\log n}{2n} 1 \right\}, \quad (30)$$

where vector $\overline{H}$ is defined in (20), V is the entropy dispersion matrix for $(X_1, X_2)$, and $\mathscr{Q}_{inv}(V, \epsilon)$ is defined as the multidimensional counterpart of the function $Q^{-1}(.)$ as $$\mathscr{Q}_{inv}(V, \epsilon) \triangleq \{z \in \mathbb{R}^d : \mathbb{P}[Z \leq z] \geq 1 - \epsilon\}. \quad (31)$$

Note that $\mathscr{R}^*(n, \epsilon) \subset \mathbb{R}^2$ but $\overline{\mathscr{R}}^*(n, \epsilon) \subset \mathbb{R}^3$. The inner and outer bounding sets can be defined as follows $$\mathcal{R}_{in}^*(n, \epsilon) \triangleq \left\{ R \in \mathbb{R}^2 : \overline{R} \in \overline{\mathcal{R}}^*(n, \epsilon) + O\left(\frac{1}{n}\right)1 \right\} \quad (32)$$

$$\mathcal{R}_{out}^*(n, \epsilon) \triangleq \left\{ R \in \mathbb{R}^2 : \overline{R} \in \overline{\mathcal{R}}^*(n, \epsilon) - O\left(\frac{1}{n}\right)1 \right\}. \quad (33)$$

When a pair of stationary, memoryless sources is utilized with single-letter joint distribution $P_{X_1X_2}$ satisfying (27)-(29), for any $0 < \epsilon < 1$, the $(n, \epsilon)$-rate region $\mathcal{R}^*(n, \epsilon)$ satisfies $$\mathcal{R}_{in}^*(n,\epsilon) \subseteq \mathcal{R}^*(n,\epsilon) \subseteq \mathcal{R}_{out}^*(n,\epsilon). \quad (34)$$

Since the upper and lower bounds agree up to their third-order terms, we call $\overline{\mathcal{R}}^*(n, \epsilon)$ the third-order MASC rate region.

Figure 3:
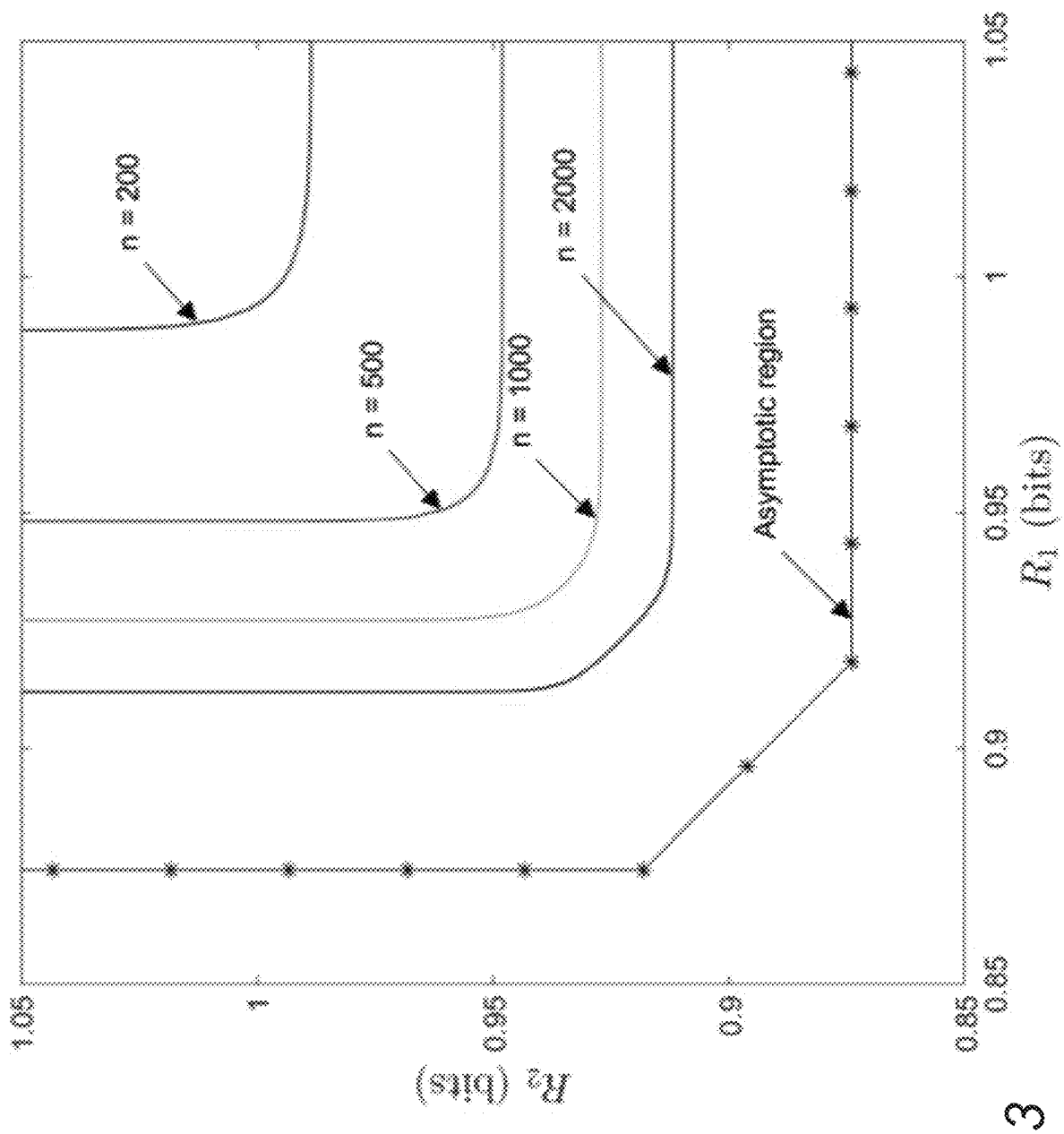
FIG. 3 is a plot showing the third-order rate region for systems and methods that perform Multiple Access Source Coding (MASC) in accordance with various embodiments of the invention.

FIG. 3 plots the boundaries $\overline{\mathcal{R}}^*(n, \epsilon)$ at different values of n for an example pair of sources. The third-order MASC rate regions $\overline{\mathcal{R}}^*(n, \epsilon)$ at $\epsilon = 10^{-3}$ are shown for stationary, memoryless sources $(X_1, X_2)$ with $p_{x_1,x_2}(0, 0) = \frac{1}{2}$, $p_{x_1,x_2}(0, 1) = p_{x_1,x_2}(1, 1) = p_{x_1,x_2}(1, 1) = \frac{1}{6}$.

For point-to-point source coding, zero varentropy means that the source is uniform; the $$-\frac{\log n}{2n}$$

third-order term is absent in that case. While condition (27) limits the third-order MASC rate region considered above to sources with positive varentropies, the case where one or more varentropies are zero is discussed below. Roughly, each zero varentropy yields a zero dispersion, and the absence of a $$-\frac{\log n}{2n}$$

third-order term, similar to the point-to-point case. Furthermore, if $V(X_1|X_2) > 0$ but $\mathbb{E}[V_c(X_1|X_2)] = 0$, the corresponding achievable third order term increases from $$-\frac{\log n}{2n}$$

to 0.

In this context, the third-order MASC rate region described above can be generalized to any finite number of encoders. Let $T \subset \mathbb{N}$ be a nonempty ordered set with a unique index for each encoder. For any vector $R_T \in \mathbb{R}^{|T|}$, the $(2^{|T|}-1)$-dimensional vector of its partial sums can be defined as $$\overline{R}_T \triangleq \left( \sum_{i \in \mathcal{A}} R_i, \hat{T} \in \mathcal{P}(T) \right). \quad (35)$$

For any distribution $P_{X_T}$ defined on $X_T$ and any $x_T \in X_T$, $(2^{|T|}-1)$-dimensional vectors can be defined as follows:

$$\bar{\imath}_T(x_T) \triangleq (i(X_{\hat{T}}|x_{T\backslash\hat{T}}), \hat{T} \in \mathcal{P}(T)) \quad (36)$$

$$\overline{H}_T \triangleq \mathbb{E}[\bar{\imath}_T(X_T)], \quad (37)$$

and $(2^{|T|}-1) \times (2^{|T|}-1)$ entropy dispersion matrix $$V_T \triangleq \text{Cov}[\bar{\imath}_T(X_T)] \quad (38)$$

for random vector $X_T$. The following set can be defined $$\overline{\mathcal{R}}_T^*(n, \epsilon) \triangleq \overline{H}_T + \frac{Q_{inv}(V_T, \epsilon)}{\sqrt{n}} - \frac{\log n}{2n} 1. \quad (39)$$

Thus, $\mathcal{R}_T^*(n, \epsilon) \subset \mathbb{R}^{|T|}$ while $\overline{\mathcal{R}}_T^*(n, \epsilon) \subset \mathbb{R}^{2^{|T|}-1}$. Finally, $$\mathcal{R}_{in,T}^*(n, \epsilon) \triangleq \left\{ R_T \in \mathbb{R}^{|T|} : \overline{R}_T \in \overline{\mathcal{R}}_T^*(n, \epsilon) + O\left(\frac{1}{n}\right)1 \right\} \quad (40)$$

$$\mathcal{R}_{out,T}^*(n, \epsilon) \triangleq \left\{ R_T \in \mathbb{R}^{|T|} : \overline{R}_T \in \overline{\mathcal{R}}_T^*(n, \epsilon) - O\left(\frac{1}{n}\right)1 \right\}. \quad (41)$$

If every element of $\bar{\imath}_T(X_T)$ has a positive variance and a finite third centered1 moment, then for any $0 < \epsilon < 1$, $$\mathcal{R}_{in,T}^*(n,\epsilon) \subseteq \mathcal{R}_{hd\ T}^*(n,\epsilon) \subseteq \mathcal{R}^*(n,\epsilon). \quad (42)$$

Comparison with Point-to-Point Source Coding

FIGS. 2A and 2B compare joint (point-to-point) compression of $(X_1^n, X_2^n)$ to the MASC sum-rate at the symmetrical rate point $(R_1 = R_2)$. The gap between the MASC and point-to-point HT converses captures a penalty due to separate encoding. For small n, the third-order Gaussian approximation (without the $$O\left(\frac{1}{n}\right)$$

term) is more accurate at $\epsilon = 10^{-1}$ than at $\epsilon = 10^{-3}$ since the $$O\left(\frac{1}{n}\right)$$

term blows up as $\epsilon$ approaches 0.

It can be shown that optimal MASC incurs no first-order penalty in achievable stun rate when compared to joint coding A quantity known as the local dispersion can be utilized to characterize the second-order speed of convergence to any asymptotic MASC rate point from any direction. For any non-corner point on the diagonal boundary of the asymptotic MASC rate region, the sum rate's second-order coefficient is optimal when approached either vertically or horizontally. Approaching corner points can incur a positive second-order penalty relative to point-to-point, coding. The MASC penalty can be bounded by considering the achievable sum rate $R_1 + R_2$ for different choices of $R_1$ and $R_2$. The cases where $X_1$ and $X_2$ are dependent and $X_1$ and $X_2$ are independent can be separately addressed, assuming throughout that (27) and (28) hold.

Figure 4A:
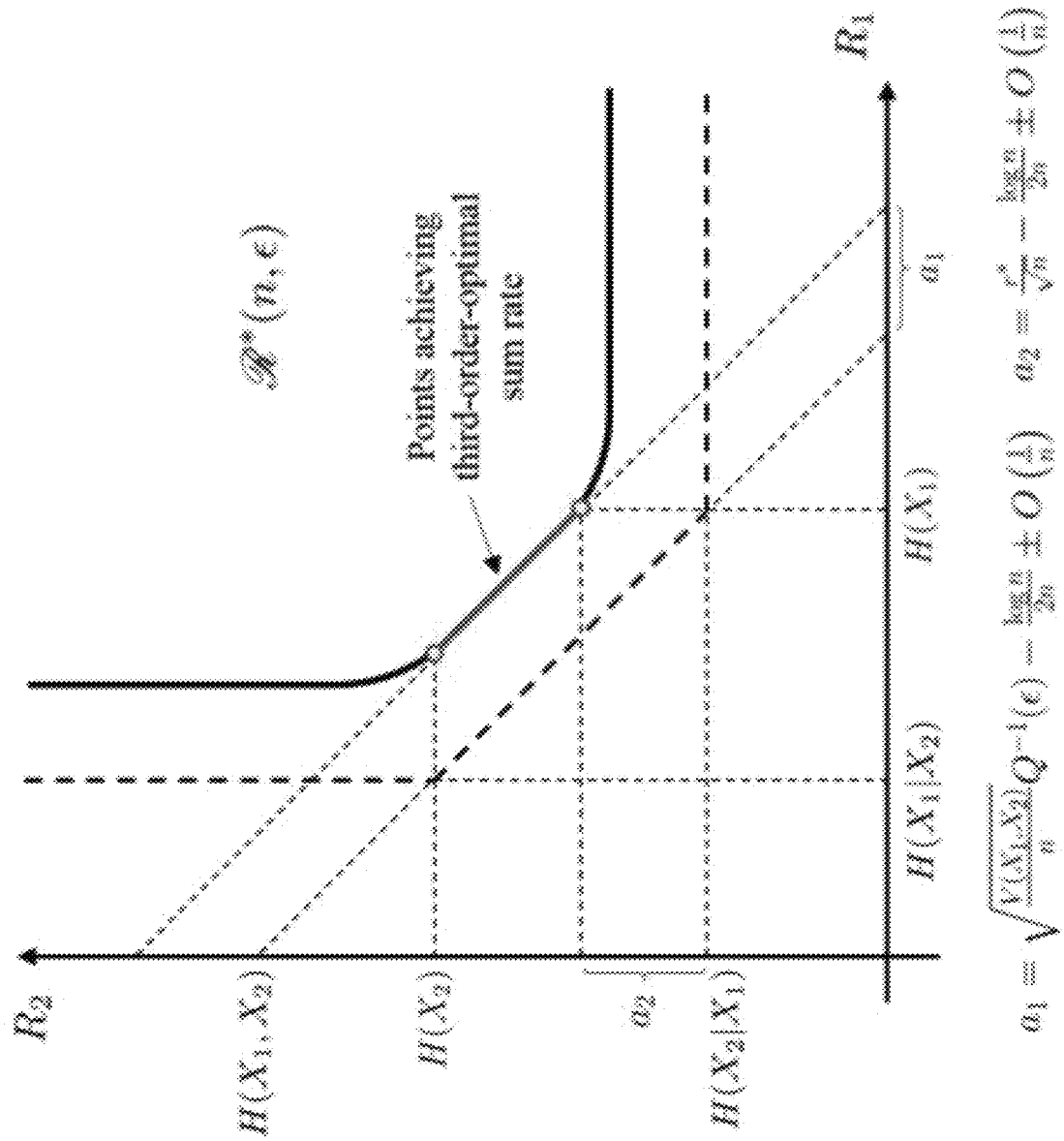
FIGS. 4A and 4B are schematic plots of the (n, $\epsilon$)-rate region and the third-order-optimal sum rate when the pair of random variables $X_1$, $X_2$ are dependent (FIG. 4A), and when $X_1$, $X_2$ are independent (FIG. 4B).
Figure 4B:
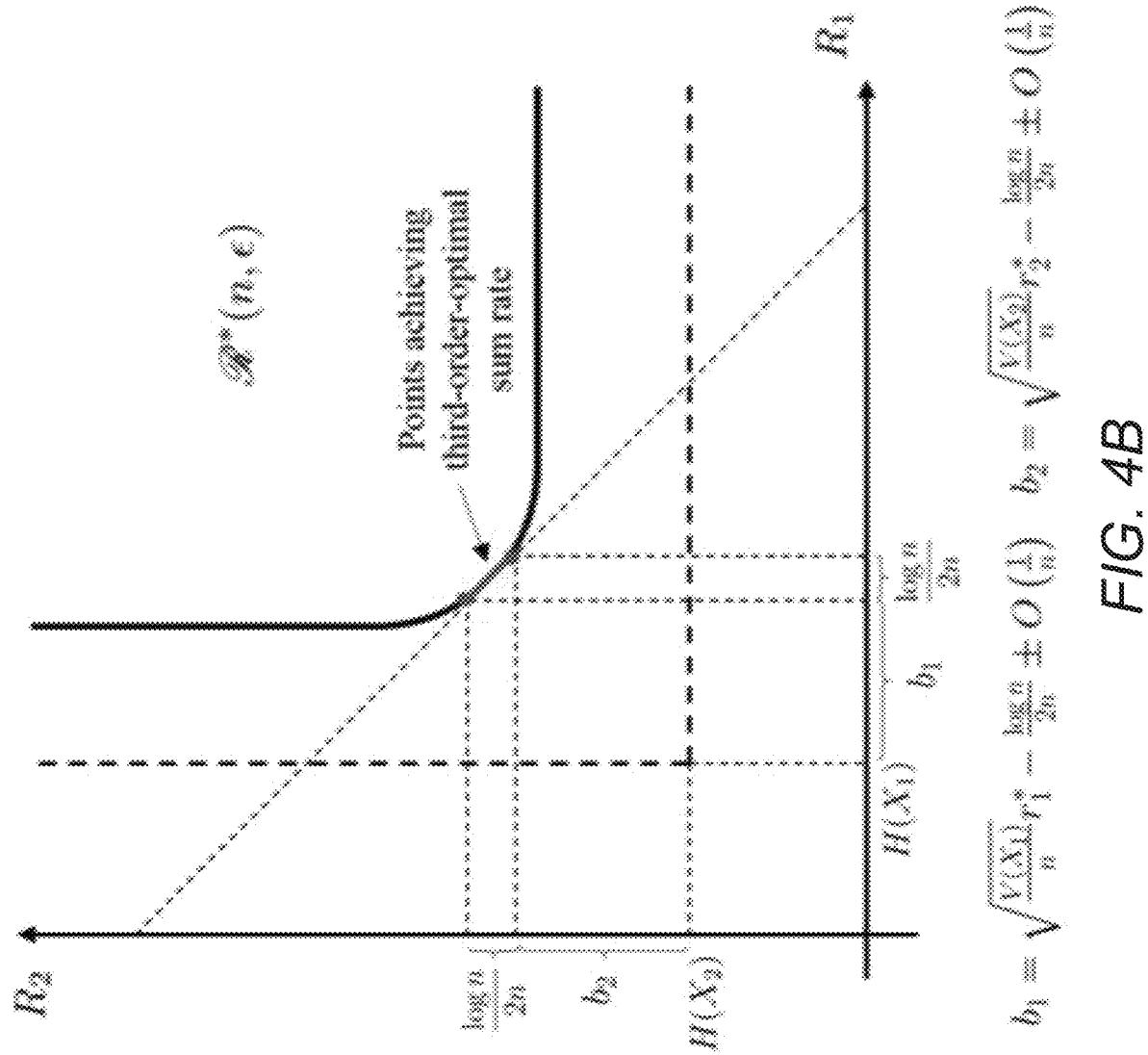

When $X_1$ and $X_2$ are dependent, $H(X_1) + H(X_2) > H(X_1, X_2) > H(X_1|X_2) + H(X_2|X_1)$, and the asymptotic sum-rate boundary contains non-corner and corner points. It can be shown that a MASC incurs no first-, second-, or third-order performance penalty relative to joint coding at non-corner points (i.e., when $R_1 < H(X_1)$ and $R_2 < H(X_2)$). In contrast, a MASC suffers a second-order performance penalty at corner points (i.e., when $R_1 = H(X_1)$ or $R_2 = H(X_2)$). See FIG. 4A for an illustration. FIGS. 4A and 4B are schematic plots of the $(n, \epsilon)$-rate region and the third-order-optimal sum rate when $X_1, X_2$ are dependent (FIG. 4A), $X_1, X_2$ are independent (FIG. 4B). In FIG. 4A, the boundary of $R^*(n, \epsilon)$ between $H(X_1)$ and $H(X_2)$ (excluding the end points) contains rate points that achieve the optimal point-to-point rate up to the third order, while the end points do not achieve that optimal rate. The value of r* in FIG. 4A is defined in (49). The values of $r_1^*$, $r_2^*$ in FIG. 4B are defined as $$(r_1^*, r_2^*) = \arg \min_{\substack{(r_1, r_2): \\ \Phi(r_1)\Phi(r_2) \geq 1-\epsilon}} \left(\sqrt{V(X_1)}\, r_1 + \sqrt{V(X_2)}\, r_2\right). \quad (43)$$

Suppose that $X_1$ and $X_2$ are dependent.
1. The constants $\delta_1$, $\delta_2$, G>0 and $\epsilon \in (0,1)$ can be fixed. Then there exists some constant $n(\delta_1, \delta_2, G)$ such that if $$R_1 \leq H(X_1) - \delta_1 \quad (44)$$

$$R_2 \leq H(X_2) - \delta_2 \quad (45)$$

$$R_1 + R_2 = H(X_1, X_2) + \sqrt{\frac{V(X_1, X_2)}{n}}\, Q^{-1}\left(\epsilon - \frac{G}{\sqrt{n}}\right) - \frac{\log n}{2n} \quad (46)$$

then $R=(R_1, R_2) \in \overline{\mathscr{R}}^*(n, \epsilon)$ for all $n > n(\delta_1, \delta_2, G)$.

2. When $\epsilon \in (0, 1)$ is fixed. If $$R_2 \geq H(X_2 \mid X_1) + \frac{r^*}{\sqrt{n}} - \frac{\log n}{2n} + \frac{G}{n} \quad (47)$$

for some G>0, then $R=(H(X_1), R_2) \in \overline{\mathscr{R}}^*(n, \epsilon)$. Conversely, if $R=(H(X_1), R_2) \in \overline{\mathscr{R}}^*(n, \epsilon)$, then $$R_2 \geq H(X_2|X_1) + \frac{r^*}{\sqrt{n}} - \frac{\log n}{2n}, \quad (48)$$

where r* is the solution to equation $$\Phi(V_2; r; r) = 1 - \epsilon, \quad (49)$$

and $V_2$ is the covariance matrix for random vector $(i(X_2|X_1), i(X_1, X_2))$.

For independent sources, the asymptotic sum-rate boundary contains only the single (corner) point $(R_1, R_2)=(H(X_1), H(X_2))$, and the entropy dispersion matrix $$\begin{bmatrix} V(X_1) & 0 \\ 0 & V(X_2) \end{bmatrix}.$$

is singular.

The next result concerns the third-order-optimal sum rate $$\overline{R}_{sum}^*(n,\epsilon) \min\{R_1+R_2 : \exists R=(R_1,R_2) \text{ s.t. } \overline{R} \in \overline{\mathscr{R}}^*(n,\epsilon)\}. \quad (50)$$

According to the third-order MASC rate region described above, $\overline{R}_{sum}^*(n, \epsilon)$ characterizes the best achievable sum rate in SW source coding up to an $$o\left(\frac{1}{n}\right)$$

gap.

For independent sources a unique $(r_1^*, r_2^*)$ can capture the best MASC second-order sum-rate; the third-order term is achieved at all points on a segment of the rate region boundary. See FIG. 4B. Under assumption (27), $$\min_{\substack{(r_1, r_2): \\ \Phi(r_1)\Phi(r_2) \geq 1-\epsilon}} \left(\sqrt{V(X_1)}\, r_1 + \sqrt{V(X_2)}\, r_2\right) > \sqrt{V(X_1)+V(X_2)}\, Q^{-1}(\epsilon), \quad (51)$$

where $V(X_1)+V(X_2)=V(X_1, X_2)$ for $(X_1, X_2)$ independent. Here (51) follows since its left-hand side solves $$\min_{(a_1, a_2)} (a_1 + a_2) \quad (52)$$

$$\text{s.t. } \Phi\left(\frac{a_1}{\sqrt{V(X_1)}}\right) \Phi\left(\frac{a_2}{\sqrt{V(X_2)}}\right) \geq 1 - \epsilon,$$

and the constraint in (52) requires $a_1 > \sqrt{V(X_1)} Q^{-1}(\epsilon)$ and $a_2 > \sqrt{V(X_2)} Q^{-1}(\epsilon)$, which gives the bound since $$\sqrt{V(X_1)} + \sqrt{V(X_2)} > \sqrt{V(X_1)+V(X_2)}. \quad (53)$$

Therefore, when $X_1$ and $X_2$ are independent, a MASC approach incurs a positive second-order sum-rate penalty relative to joint coding. Closed-form expressions for this penalty are available in special cases. When $V(X_1)=V(X_2)$, $r_1^*=r_2^*=Q^{-1}(1-\sqrt{1-\epsilon})$, and the penalty is $$2\sqrt{\frac{V(X_1)}{n}}\, Q^{-1}\left(1-\sqrt{1-\epsilon}\right) - \sqrt{\frac{2V(X_1)}{n}}\, Q^{-1}(\epsilon). \quad (54)$$

When $X_1$ and $X_2$ are i.i.d., the penalty equals the penalty for coding a vector $X^{2n}$ of 2n i.i.d. outputs from $P_X$ by applying an independent (n, $\epsilon$) (point-to-point) code with error probability $1-\sqrt{1-\epsilon}$ to each of $(X_1, \ldots, X_n)$ and $(X_{n+1}, \ldots, X_{2n})$ instead of a single (2n, $\epsilon$) code to vector $X^{2n}$.

Limited Feedback and Cooperation

Figure 5A:
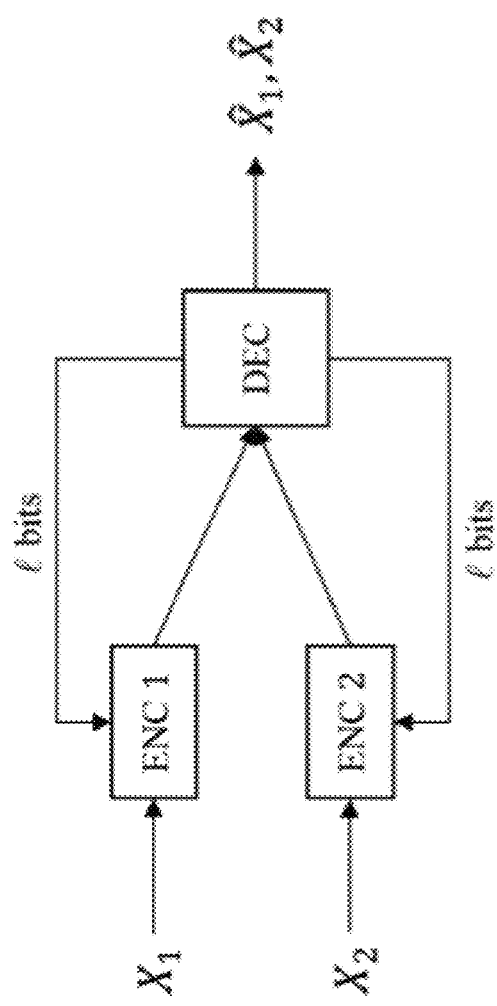
FIG. 5A illustrates a MASC system incorporating feedback and FIG. 5B illustrates a MASC system that utilizes a cooperation facilitator.
Figure 5B:
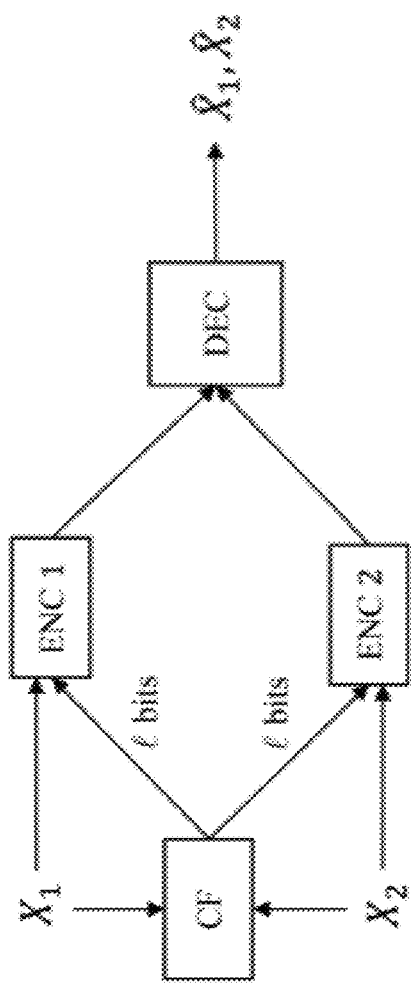

Systems and methods in accordance with various embodiments of the invention that are employed in MASC scenarios can utilize limited feedback. In several embodiments, the decoder broadcasts the same l bits of feedback to all encoders. A bit sent at time i is a function of the encoder outputs received in time steps $1, \ldots, i-1$. (See FIG. 5A.) The impact of feedback can be bounded by studying a MASC with a cooperation facilitator (CF). The CF broadcasts the same l-bit function of the sources to both encoders prior to their encoding operations. (See FIG. 5B.) Since the MASC network has no channel noise, feedback from the decoder cannot convey more information than feedback from the CF. As a result, the impact of feedback can be bound by bounding the impact of cooperation.

The CF-MASC and its rate region can be defined as follows. An (L, $M_1$, $M_2$, $\epsilon$) CF-MASC for random variables $(X_1, X_2)$ on $X_1 \times X_2$ includes a CF function L, two encoding functions $f_1$ and $f_2$, and a decoding function g given by L: $X_1 \times X_2 \to [L]$
$f_1$: $[L] \times X_1 \to [M_1]$
$f_2$: $[L] \times X_2 \to [M_2]$
g: $[M_1] \times [M_2] \to X_1 \times X_2$, with error probability $$P[g(f_1(L(X_1,X_2),X_1), f_2(L(X_1,X_2),X_2)) \neq (X_1,X_2)] \leq \epsilon.$$

An (n, L, $M_1$, $M_2$, $\epsilon$) MASC is a CF-MASC for random variables $(X_1^n, X_2^n)$ on $X_1^n \times X_2^n$. The code's finite blocklength rates are defined by $$R_1 = \frac{1}{n}\log M_1, R_2 = \frac{1}{n}\log M_2. \quad (55)$$

A rate pair $(R_1, R_2)$ is $(n, 1, \epsilon)$-CF achievable if there exists an $(n, L, M_1, M_2, \epsilon)$ CF-MASC with $M_1 \leq \exp(nR_1)$, $M_2 \leq \exp(nR_2)$, and $L \leq \exp(l)$. The $(n, 1, \epsilon)$-CF rate region $\mathcal{R}_{CF}^*(n, 1, \epsilon)$ can be defined as the closure of the set of all $(n, 1, \epsilon)$-CF achievable rate pairs.

$\mathcal{R}_{FB}^*(n, 1, \epsilon)$ can be used to denote the feedback-MASC (FB-MASC) rate region, which can be defined as the closure of the set of all $(n, \epsilon)$-achievable rate pairs when the same 1 bits of feedback from the decoder are available to both encoders.

Since the CF sees the source vectors while the decoder sees a coded description of those vectors (using a deterministic code), an l-bit CF can implement any function used to determine the decoder's l-bit feedback. As a result, any rate point that is achievable by an l-bit FB-MASC is also achievable by an l-bit CF-MASC. Therefore, for any $0 < \epsilon < 1$ and $1 < \infty$, $$\mathcal{R}_{FB}^*(n,l,\epsilon) \subseteq \mathcal{R}_{CF}^*(n,l,\epsilon). \quad (56)$$

Consider stationary, memoryless sources with single-letter distribution $P_{X_1,X_2}$ satisfying (27) and (28). For any $0 < \epsilon < 1$ and $1 < \infty$, $$\mathcal{R}_{CF}^*(n,l,\epsilon) \subseteq \mathcal{R}_{out}^*(n,\epsilon). \quad (57)$$

Thus $\mathcal{R}_{CF}^*(n, 1, \epsilon)$ and $\overline{\mathcal{R}}^*(n, \epsilon)$ share the same outer bound.

Accordingly, the CF-MASC (and FB-MASC) performance is bounded, so that for any $1 < \infty$, the third-order rate region for f-bit CF-MASCs cannot exceed the corresponding MASC rate region. Hence finite feedback does not enlarge the third-order $(n, \epsilon)$ MASC rate region. This result generalizes to scenarios with more than two encoders.

While a variety of systems and methods for performing MASC in a manner that can achieve third-order optimal performance are described above with reference to FIGS. 2A-5B, any of a variety of systems and methods can be implemented in order to perform MASC with or without feedback and/or the use of a CF as appropriate to the requirements of specific applications in accordance with various embodiments of the invention. Furthermore, systems and methods in accordance with a number of embodiments of the invention can be utilized for the newly described RASC applications, which are discussed further below.

Random Access Source Coding

Systems and methods in accordance with many embodiments are used to perform RASC. RASC is a generalization of MASC for networks where the set of participating encoders is unknown to both the encoders and the decoder a priori.

Definitions and Coding Strategy

In a RASC system, an assumption can be made that there is maximum number of active encoder $K < \infty$. Accordingly, each encoder with a unique source from the set of sources can be indexed by [K]. In addition, each encoder can choose whether to be active or silent. Only sources associated with active encoders are compressed and reconstructed. By assumption, the decision to remain silent is independent of the observed source instance. Given the joint distribution $P_{X_{[K]}}$ on countable alphabet $X_{[K]}$, when ordered set $T \in P([K])$ of $[K]$ is active, the marginal on the transmitted sources is $$P_{X_T}(x_T) = \sum_{x_{[K] \setminus T} \in X_{[K] \setminus T}} P_{X_{[K]}}(x_{[K]}), \forall x_T \in X_T. \quad (58)$$

Thus, each encoder's state has no effect on the statistical relationship among sources observed by other encoders.

Systems and methods in accordance with many embodiments of the invention involve the use of a RASC process that organizes communication into epochs. At the beginning of each epoch, each encoder can independently decide its activity state; that activity state remains unchanged until the end of the epoch. Thus, the active encoder set T is fixed in each epoch.

Figure 6:
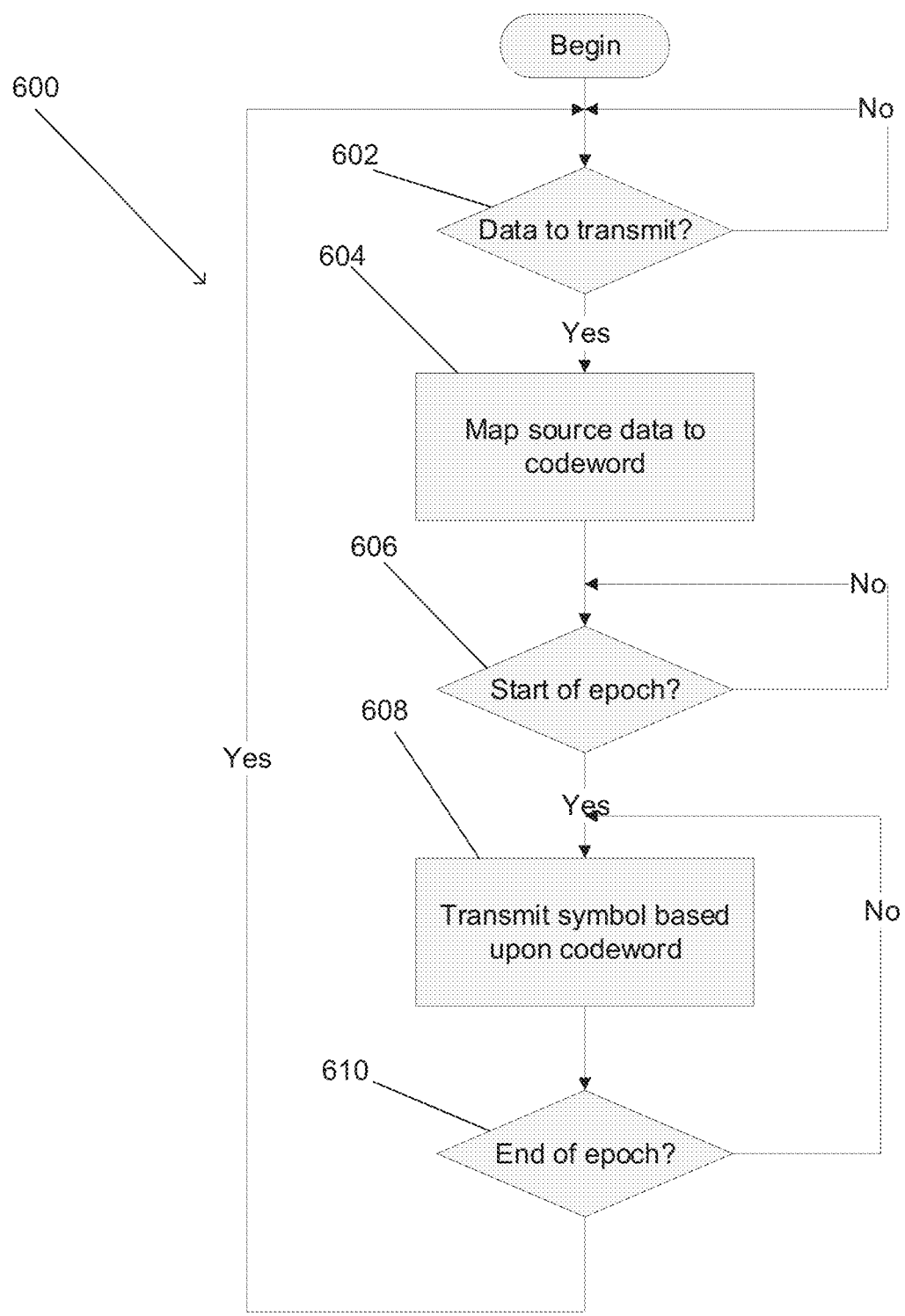
FIG. 6 is a flow chart illustrating a process that can be utilized by an encoder to perform source coding within a Random Access Source Coding (RASC) system in accordance with an embodiment of the invention.

A process 600 that can be implemented by an encoder within an RASC system in accordance with an embodiment of the invention is illustrated in FIG. 6. As illustrated in FIG. 6, each active encoder $i \in T$ observes source output. $X_i \in X_i$. When a determination (602) is made that a source output is available, the encoder independently maps (604) the source data to a codeword that includes a sequence of code symbols from alphabet $[Q_i]$. When a start of an epoch is detected (606), the |T| codewords are sent (608) simultaneously to the decoder. Since set T is unknown a priori, the encoder behavior cannot vary with T. The decoder sees T and decides a time $m_T$, called the decoding blocklength, at which to jointly decode all received partial codewords. The set of potential decoding blocklengths $M \triangleq \{m_T: T \in P([K])\}$ is part of the code design; it is known to all encoders and to the decoder. When the decoder performs the joint decoding, the decoder provides feedback to the encoder indicating (610) that the epoch has ended. The encoding and transmission process 600 repeats as more data becomes available to each encoder and as each new epoch commences.

Figure 7:
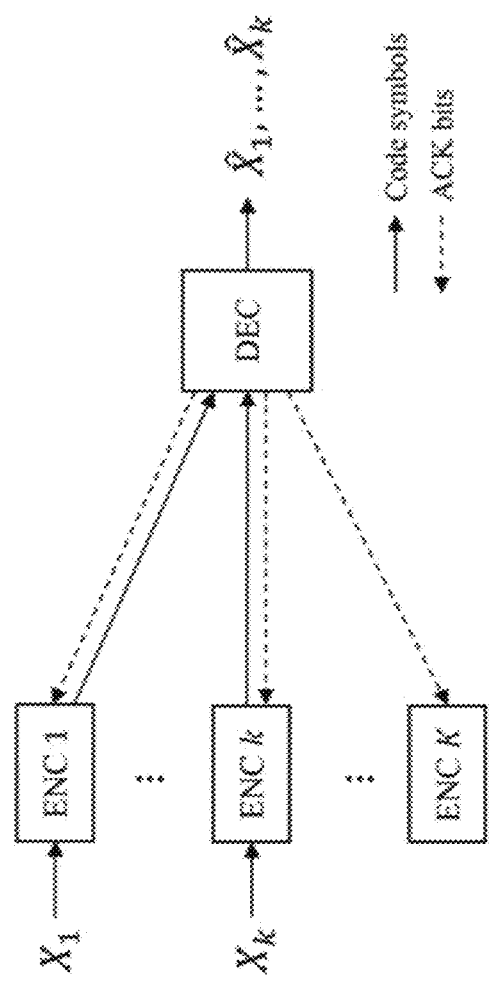
FIG. 7 conceptually illustrates an RASC system in accordance with an embodiment of the invention.
Figure 8:
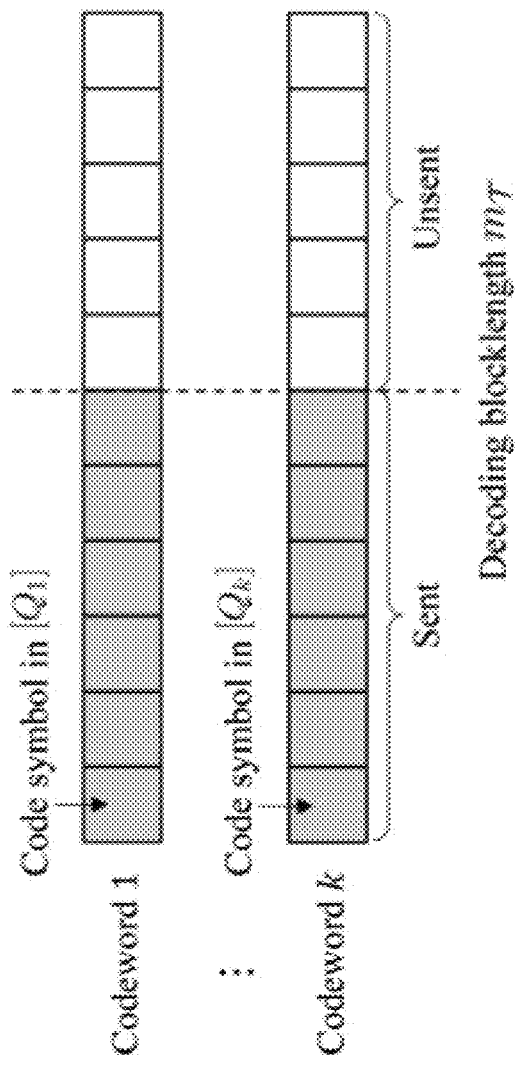
FIG. 8 conceptually illustrates a source coding scheme employed by encoders during a single time epoch in an RASC system in accordance with an embodiment of the invention.

FIGS. 7 and 8 illustrate an RASC scheme employed in accordance with an embodiment of the invention during one epoch when $T=[k]$. Each encoder $i \in T$ sends a single code symbol per time step. At each time $m \in \{m' \in M : m' < m_T\}$, the decoder sends a "0" to indicate that it is not yet ready to decode; at time $m=m_T$, the decoder sends a "1." ending one epoch and starting the next. The decoder then reconstructs source vector $X_T$ using the first $m_T$ code symbols from each active encoder. To avoid wasting time in an epoch with no active encoders, decoding time $m_\emptyset=1$ is included in set M. The decoder sends at most $2^K$ bits of feedback, and encoders need only listen for decoder feedback at the times in set M.

To formalize the above strategy, K can be fixed to $K \geq 1$. In addition, the following vectors can be defined $$\bar{\epsilon}_K \triangleq (\epsilon_T, T \in P([K])) \quad (59)$$

$$\bar{m}_K \triangleq (m_T, T \in P([K]) \cup \{\emptyset\}) \quad (60)$$

with $m_\emptyset=1$ and $m_{max} \triangleq \max\{m_T : T \in P([K])\}$.

An $(\bar{m}_K, Q_{[K]}, \bar{\epsilon}_K)$ RASC for sources $X_{[K]}$ on source alphabet $X_{[K]}$ comprises a collection of encoding and decoding functions $$f_i : X_i \to [Q_i]^{m_{max}}, i \in [K], \quad (61)$$

$$g_T : \prod_{i \in T} [Q_i]^{m_T} \to X_T, T \in P([K]), \quad (62)$$

where $f_i$ is the encoding function for source $X_i$ and $g_T$ is the decoding function for active coder set T. For each $T \in P([K])$, source vector $X_T$ is decoded at time $m_T$ with error probability $\mathbb{P}[g_T(f_i(X_i)_{[m_T]}, i \in T) \neq X_T] \leq \epsilon_T$, where $f_i(x_i)_{[m]}$ denotes the first m code symbols of $f_i(x_i)$.

Figure 9:
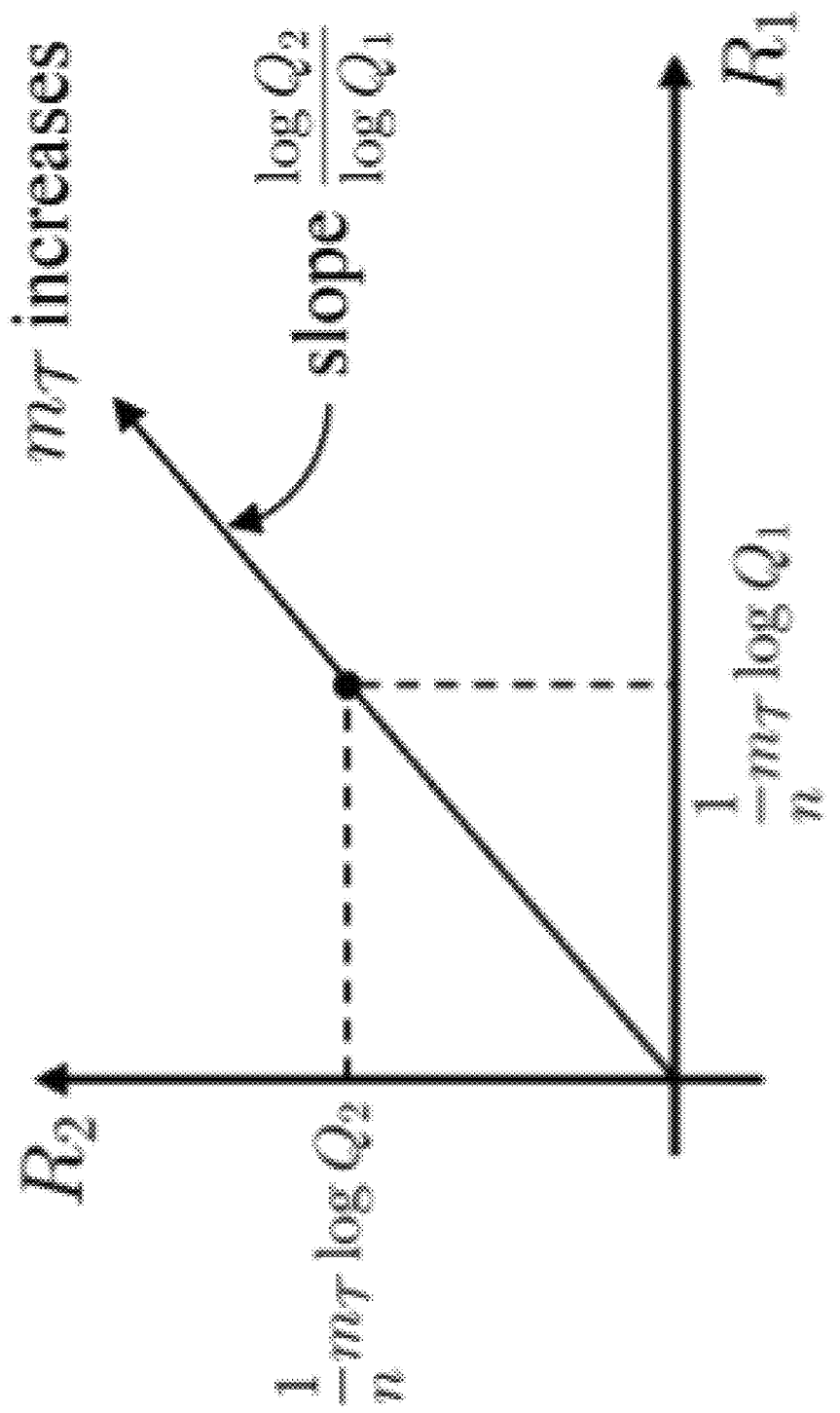
FIG. 9 shows the relationship between decoding blocklength, code symbol alphabet sizes, and source coding rate vector.

An (n, $\overline{m}_K$, $Q_{[K]}$, $\overline{\epsilon}_K$) RASC is an RASC for an n-block of source outcomes. The parameter n, called the encoding blocklength does not vary with T. An ($\overline{m}_K$, $Q_{[K]}$, $\overline{\epsilon}_K$) RASC behaves, for each T, like a (($Q_i^{m_T}$, i∈T), $\epsilon_T$) MASC with a finite number |{m∈M:m≤$m_T$}| of feedback bits. However, the RASC is one code. Its descriptions are nested so that the previously transmitted symbols are a prefix for the codeword of the next larger blocklength (i.e., for each $x_i \in X_i$, if $m_{T'} < m_T$, then $f_i(x_i)_{[m_{T'}]}$ is a prefix of $f_i(x_i)_{[m_T]}$). It simultaneously satisfies the error constraints for all T∈P([K]). And, since the code symbol alphabet sizes $Q_{[K]}$ are fixed, its rate vectors are coupled. See FIG. 9, which shows the relationship between decoding blocklength $m_T$, code symbol alphabet sizes ($Q_1$, $Q_2$), and source coding rate vector $R_T$ (illustrated for T={1, 2}).

The following definitions can be utilized to build a non-asymptotic fundamental limit of RASCs.

A collection $(R_T)_{T \in P([K])}$ of rate vectors is n-valid if ∃ ($\overline{m}_K$, $Q_{[K]}$) s.t.

$$R_T = \frac{1}{n}(m_T \log Q_i, i \in T), \forall T \in P([K]). \quad (63)$$

The set $R_{valid}(n)$ is the set of n-valid rate collections. The collection is (n, $\overline{\epsilon}_K$)-achievable if there exists an (n, $\overline{m}_K$, $Q_{[K]}$, $\overline{\epsilon}_K$) RASC scheme. The (n, $\overline{\epsilon}_K$)-rate set $R^*(n, \overline{\epsilon}_K)$ is the set of (n, $\overline{\epsilon}_K$)-achievable rate collections.

Asymptotics: Third-Order Performance of the RASC

The performance of an (n, $\overline{m}_K$, $Q_{[K]}$, $\overline{\epsilon}_K$) RASC for stationary, memoryless sources can be analyzed. Results include both achievability and converse characterizations of the (n, $\overline{\epsilon}_K$)-rate set $R^*(n, \overline{\epsilon}_K)$ under the assumption that the single-letter joint source distribution $P_{X_{[K]}}$ satisfies $$\mathbb{E}[V_c(X_{\hat{T}}|X_{T\backslash \hat{T}})] > 0 \forall \hat{T} \subseteq T \subseteq [K], \hat{T}, T \neq \emptyset \quad (64)$$

$$T(X_{\hat{T}}|X_{T\backslash \hat{T}}) < \infty \forall \hat{T} \subseteq T \subseteq [K], \hat{T}, T \neq \emptyset \quad (65)$$

$$\mathbb{E}[T_c^2(X_{\hat{T}}|X_{T\backslash \hat{T}})] < \infty \forall \hat{T} \subset T \subseteq [K], \hat{T}, T \neq \emptyset \quad (66)$$

Constraints (64)-(66) enable the use of Berry-Esseen bounds in subsequent analysis. The resulting characterization is tight up to the third-order term. While the existence of an (n, $\overline{m}_K$, $Q_{[K]}$, $\overline{\epsilon}_K$) RASC implies the existence of an (n, $(Q_i^{m_T}$, i∈T), $\epsilon_T$) MASC for each T∈P([K]), the existence of individual MASCs does not imply the existence of a single RASC that simultaneously satisfies the error probability constraints for all possible configurations of active encoders. Indeed, the ability of systems and methods in accordance with various embodiments of the invention to employ a single RASC that simultaneously performs as well (up to the third-order term) as the optimal MASC for each possible number of encoders (i.e. each T∈P([K])) is an important and surprising result.

The inner and outer bounding sets can be defined as follows:

$$R_{in}^*(n,\overline{\epsilon}_K) \triangleq \{(R_T)_{T \in P([K])} \in R_{valid}(n): R_T \in \mathscr{R}_{in,T}^*(n, \epsilon_T) \forall T \in P([K])\} \quad (67)$$

$$R_{out}^*(n,\overline{\epsilon}_K) \triangleq \{(R_T)_{T \in P([K])} \in R_{valid}(n): R_T \in \mathscr{R}_{out,T}^*(n, \epsilon_T) \forall T \in P([K])\} \quad (67)$$

where $\mathscr{R}_{in,T}^*(n, \epsilon)$ and $\mathscr{R}_{out,T}^*(n, \epsilon)$ are the third-order MASC bounding sets for distribution $P_{X_T}$. (See (40) and (41).)

Third-Order RASC Performance

For any K<∞, stationary, memoryless sources specified by a single-letter joint distribution $P_{X_{[K]}}$ satisfying (64)-(66) can be considered. For any $0 < \overline{\epsilon}_K < 1$, $$R_{in}^*(n,\overline{\epsilon}_K) \subseteq R^*(n,\overline{\epsilon}_K) \subseteq R_{out}^*(n,\overline{\epsilon}_K). \quad (69)$$

The achievability of third-order RASC performance provides a sufficient condition for the existence of a single RASC that is simultaneously good for all T∈P([K]). To prove this, an achievability result can be derived assuming that the encoders and decoder share the common randomness used to generate a random code. Unfortunately, the existence of a random code ensemble with expected error probability satisfying the error probability constraint for each T∈P([K]) does not guarantee the existence of a single deterministic code satisfying those constraints simultaneously. Therefore a different approach can be taken in accordance with many embodiments of the invention, which, unexpectedly, combines a converse bound on error probability and a random coding argument to show achievability.

The following refinement of the random coding argument provides a bound on the probability (with respect to the random code choice) that the error probability of a randomly chosen code exceeds a certain threshold. The code of interest here can be any type of source or channel code.

Given any RASC c, for each T∈P([K]) let $P_{e,T}(c)$ denote the error probability of code c under active encoder set T. Before proceeding with the proof, a random code ensemble is defined in order to calculate its expected error probability.

For any K<∞, consider a source distribution $P_{X_{[K]}}$ defined on countable alphabet $X_{[K]}$. There exists a random code ensemble C defined on the set of all RASCs with decoding blocklengths $\overline{m}_K$ and code alphabets $Q_{[K]}$ for which the following inequalities hold simultaneously for all T∈P([K]):

$$\mathbb{E}[P_{e,T}(C)] \leq \mathbb{E}\left[\min\left\{1, \sum_{\hat{\mathcal{T}} \in \mathcal{P}(T)} \exp(-m_T \cdot \overline{Q}(\hat{\mathcal{T}})) A_{\hat{\mathcal{T}}}\right\}\right], \quad (70)$$

where $$\overline{Q}(\hat{\mathcal{T}}) \triangleq \sum_{i \in \hat{\mathcal{T}}} \log Q_i \quad (71)$$

$$A_{\hat{\mathcal{T}}} \triangleq \mathbb{E}[\exp(\iota(\overline{X}_{\hat{\mathcal{T}}} | X_{T\backslash \hat{\mathcal{T}}}))\cdot$$

$$1\{\iota(\overline{X}_{\hat{\mathcal{T}}}|X_{T\backslash \hat{\mathcal{T}}}) \leq \iota(X_{\hat{\mathcal{T}}}|X_{T\backslash \hat{\mathcal{T}}})\} | X_T] \quad (72)$$

and the expectation in (72) is with respect to the conditional distribution $$P_{\overline{X}_{\hat{\mathcal{T}}}|X_T} = P_{X_{\hat{\mathcal{T}}}|X_{T\backslash \hat{\mathcal{T}}}}. \quad (73)$$

When parameters (n, $Q_{[K]}$, $\overline{\epsilon}_K$) are fixed, increasing $\lambda_T$ yields larger decoding blocklengths $m_T$. Therefore, the choice of $(\lambda_T)_{T \in P([K])}$ to satisfy $$\sum_{T \in \mathcal{P}([K])} \frac{1}{\lambda_T + 1} < 1, \quad (74)$$

controls the RASC performance trade-off across different active encoder sets. This trade-off affects the performance of the RASC in the fourth- or higher-order terms.

RASC for Permutation-Invariant Sources

Figure 10:
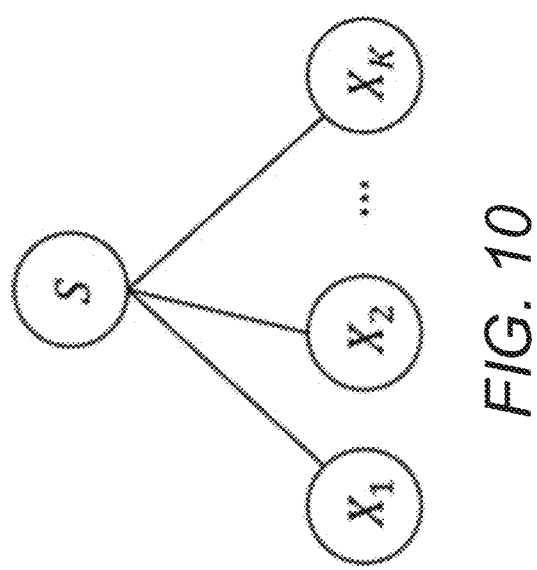
FIG. 10 shows a number of sensors reading measurements of a common hidden state as an example of an application of RASC in accordance with an embodiment of the invention.

A permutation-invariant source is defined by the constraint $$P_{x_{[K]}}(x_{[K]}) = P_{x_{[K]}}(x_{\pi([K])}) \quad (75)$$

for all permutations $\pi$ on [K] and all $x_{[K]} \in X_{[K]}$. For example, given any $P_S$ and $P_{X|S}$, the marginal $P_{X_{[K]}}$ of $P_{X_{[K]}S} = (P_{X|S})^K P_S$ satisfies (75). Such "hidden variable" models have applications in statistics, science, and economics, where latent variables (e.g., the health of the world economy or the state of the atmosphere) influence observables (e.g., stock prices or climates). FIG. 10 shows an example with K sensors reading measurements of a common hidden state S.

Permutation-invariant source models can be of interest both because of their wide applicability and because they present an opportunity for code simplification through identical encoding, where all encoders employ the same encoding map. For any permutation-invariant source, (58) and (75) imply that $X_i = X$ for all $i \in [K]$ and, for any $T \in P([K])$ with $|T| = k$, $$P_{X_T} = P_{X_{[k]}}. \tag{76}$$

Thus, $P_{X_T}$ is permutation-invariant for every T and the joint source distribution depends on the number of active encoders but not their identities. Assuming the same error probability $\epsilon_k$ is further employed for all $T \in P([K])$ with $|T| = k$, a single decoding blocklength can be fixed for each number $k \in [K]$ of active encoders. Furthermore, identical encoders can be utilized at all transmitters, allowing the accommodation of an arbitrarily large number of encoders without designing a unique encoder for each source.

In analyzing RASC performance with identical encoders on a permutation-invariant source, an assumption can be made in addition to (64) and (65) that no two sources are identical, i.e., $$\mathbb{P}\left[\bigcup_{i,j \in [K], i \neq j} \{X_i = X_j\}\right] < 1. \tag{77}$$

This can be important since using identical encoders on identical sources yields identical descriptions, in which case descriptions from multiple encoders are no better than descriptions from a single encoder. Under these assumptions, third-order RASC performance continues to hold. A number of embodiments of the invention utilize a modified decoder that outputs the most probable source vector $x_T \in X_T$ that contains no repeated symbols, treating the case where $X_T$ contains repeated symbols as an error. In several embodiments, the system permits multiple identical sources and the decoder relies upon a system configuration in which multiple identical sources are active with low likelihood. In certain embodiments, a decoder can detect that multiple identical sources are active and can command all except one of the identical sources to cease activity. In several embodiments, a source encoder ceases activity for a specified and/or random period of time. In the asymptotic analysis for stationary, memoryless sources, the probability of this error event is bounded by $$\mathbb{P}\left[\bigcup_{i,j \in [K], i \neq j} \{x_i^n = x_j^n\}\right] \tag{78}$$

$$\leq \left(\mathbb{P}\left[\bigcup_{i,j \in [K], i \neq j} \{X_i = X_j\}\right]\right)^n,$$

which decays exponentially in n by (77). Therefore, under the assumption in (77), identical encoding does not incur a first-, second-, or third-order performance penalty.

MASC Using Sources with Less Redundancy

Referring again to systems and methods in accordance with various embodiments of the invention that employ MASC, the asymptotic achievability result for the MASC schemes described above requires that all $V(X_1, X_2)$, $V(X_1|X_2)$, and $V(X_2|X_1)$ are strictly positive (as an implication of assumption (27)). Thus, the analysis presented above can break down when any of these varentropies is equal to zero. Such a source can be referred to as being less redundant. Accordingly, the performance systems and methods that perform MASC in accordance with a number of embodiments of the invention can be analyzed when utilized in combination with less redundant sources. Specifically, a pair of stationary, memoryless sources can be analyzed with respect to the following three cases:

1) all three varentropies are equal to zero;
2) exactly two of the varentropies are equal to zero;
3) exactly one of the varentropies is equal to zero.

The assumption can be maintained that the joint distribution $P_{X_1X_2}$ satisfies (28) and (29). For those cases in which $V(X_2|X_1) > 0$, the assumption can be maintained that $E[V_c(X_2|X_1)] > 0$. Furthermore, if $V(X_1|X_2) > 0$, the assumption can be maintained that $E[V_c(X_1|X_2)] > 0$.

When encoders are required to operate independently in a MASC, it is typically not a simple matter to find optimal codes. In Section A below, characterizations of the (n, $\epsilon$)-rate region are provided with respect to the three general cases listed above. Then, in Section B, the case where $P_{X_1X_2}(x_1, x_2) > 0$ for every $(x_1, x_2) \in X_1 \times X_2$ is considered; under this condition, the optimal codes can be found and analyzed directly.

Section A: General Characterizations of the (n, $\epsilon$)-Rate Region

The results in the three general cases are listed below.

Case 1): Suppose that $V(X_1|X_2) = 0$, $V(X_2|X_1) = 0$, and $V(X_1, X_2) = 0$. For any $\delta_1, \delta_2, \delta_{12} > 0$, let $$\hat{\mathcal{R}}_{in}^{(1)}(n, \delta_1, \delta_1, \delta_{12}) \triangleq \{(R_1, R_2) \in \mathbb{R}^2 : \tag{79}$$

$$R_1 \geq H(X_1|X_2) + \frac{1}{n}\log\frac{1}{\delta_1}$$

$$R_2 \geq H(X_2|X_1) + \frac{1}{n}\log\frac{1}{\delta_2}$$

$$R_1 + R_2 \geq H(X_1, X_2) + \frac{1}{n}\log\frac{1}{\delta_{12}}\}.$$

Define $$\mathcal{R}_{in}^{(1)}(n, \epsilon) \triangleq \bigcup_{\substack{\delta_1, \delta_2, \delta_{12} > 0 \\ \delta_1 + \delta_2 + \delta_{12} = \epsilon}} \hat{\mathcal{R}}_{in}^{(1)}(n, \delta_1, \delta_2, \delta_{12}) \tag{80}$$

$$\mathcal{R}_{out}^{(1)}(n, \epsilon) \triangleq \{(R_1, R_2) \in \mathbb{R}^2 :$$

$$R_1 \geq H(X_1|X_2) + \frac{1}{n}\log\frac{1}{1-\epsilon}$$

$$R_2 \geq H(X_2|X_1) - \frac{1}{n}\log\frac{1}{1-\epsilon}$$

$$R_1 + R_2 \geq H(X_1, X_2) - \frac{1}{n}\log\frac{1}{1-\epsilon}\}. \tag{81}$$

When $V(X_1|X_2) = 0$, $V(X_2|X_1) = 0$, and $V(X_1, X_2) = 0$, the (n, $\epsilon$)-rate region $\mathcal{R}^*(n, \epsilon)$ satisfies $$\mathcal{R}_{in}^{(1)}(n, \epsilon) \subseteq \mathcal{R}^*(n, \epsilon) \subseteq \mathcal{R}_{out}^{(1)}((n, \epsilon)). \tag{82}$$

As in the point-to-point scenario, there are no second-order dispersion terms or $$-\frac{\log n}{2n}$$

third-order terms in the characterization of $\mathscr{R}^*(n, \epsilon)$ in this case. For any n and $\epsilon$, the achievable region $\mathscr{R}_{in}^{(1)}(n, \epsilon)$ has a curved boundary due to the trade-off in the $$o\left(\frac{1}{n}\right)$$

fourth-order terms, while the converse region $\mathscr{R}_{out}^{(1)}(n, \epsilon)$ has three linear boundaries.

Case 2): There are three possible cases where exactly two of the three varentropies are equal to zero. Here, we suppose that $V(X_1|X_2)>0$ while $V(X_2|X_1)=V(X_1, X_2)=0$. The other two cases can be analyzed in the same way.

When $V(X_1|X_2)>0$, $V(X_2|X_1)=0$, and $V(X_1, X_2)=0$, the $(n, \epsilon)$-rate region $\mathscr{R}^*(n, \epsilon)$ satisfies $$\mathscr{R}_{in}^{(2)}(n,\epsilon) \subseteq \mathscr{R}^*(n,\epsilon) \subseteq \mathscr{R}_{out}^{(2)}(n,\epsilon). \tag{83}$$

The achievable region $\mathscr{R}_{in}^{(2)}(n, \epsilon)$ has a curved boundary due to the trade-off in $\delta_1$, $\delta_2$, and $\delta_{12}$. If $$\delta_1 = \epsilon - \frac{2}{\sqrt{n}}, \delta_2 = \frac{1}{\sqrt{n}}, \delta_{12} = \frac{1}{\sqrt{n}}, \tag{84}$$

then it is apparent that the dispersion corresponding to $R_1$ is $V(X_1|X_2)$ with a $$-\frac{\log n}{2n}$$

third-order term, while the dispersions of $R_2$ and $R_1+R_2$ are zero.

Case 3): Similar to Case 2), there are three possible cases where exactly one of the three varentropies is equal to zero. Here, the case where $V(X_1|X_2)=0$ while $V(X_2|X_1)>0$ and $V(X_1, X_2)>0$ is considered. When $V(X_1|X_2)=0$, $V(X_2|X_1)>0$, and $V(X_1, X_2)>0$, the $(n, \epsilon)$-rate region $\mathscr{R}^*(n, \epsilon)$ satisfies $$\mathscr{R}_{in}^{(3)}(n,\epsilon) \subseteq \mathscr{R}^*(n,\epsilon) \subseteq \mathscr{R}_{out}^{(3)}(n,\epsilon). \tag{85}$$

For any n and $\epsilon$, the achievable region $\mathscr{R}_{in}^{(3)}(n, \epsilon)$ has a curved boundary that is characterized by the trade-off between a separate bound on $R_1$ and a region in $R^2$ that bounds $(R_2, R_1+R_2)$ jointly. The converse region $\mathscr{R}_{out}^{(3)}(n, \epsilon)$ is the intersection of a region with a linear boundary that bounds $R_1$ only and a region with a curved boundary that bounds $(R_2, R_1+R_2)$ jointly. Letting $$\delta = \frac{1}{\sqrt{n}}, \tag{86}$$

then it is apparent that the dispersion corresponding to $R_2$ and $R_1+R_2$ is given by $V_2$ with a $$-\frac{\log n}{2n}$$

third-order term, while the dispersion of $R_1$ is zero.

A less redundant stationary, memoryless source has some useful properties. When $V(X_1, X_2)=0$, $$P_{X_1^n X_2^n}(x_1^n, x_2^n) \in \{0, \exp(-nH(X_1, X_2))\}, \tag{87}$$

for every $(x_1^n, x_2^n) \in X_1^n \times X_2^n$; in other words, $(X_1, X_2)$ is uniformly distributed over its support in $X_1 \times X_2$. When $V(X_1|X_2)=0$, $$P_{X_1^n|X_2^n}(x_1^n|x_2^n) = \begin{cases} \exp(-nH(X_1|X_2)), & \\ \quad \text{if } P_{X_1^n X_2^n}(x_1^n, x_2^n) > 0 \\ 0, \text{otherwise;} \end{cases} \tag{88}$$

in other words, $X_1$ is uniformly distributed over its conditional support for each $x_2 \in X_2$. When $V(X_2|X_1)=0$, a result analogous to (88) holds. These properties do not reduce the difficulty of characterizing the optimal MASCs in general. As a result, the random coding techniques described above are utilized. For the achievability argument, the MASC RCU bound described above can be invoked.

Section B: Two Special Cases

The analysis above applies to any stationary, memoryless source with single-letter distribution $P_{x_1 x_2}$, that satisfies (28). In such a general setting, it is hard to find an optimal code. However, there are some special cases in which the optimal codes for a less redundant source can be characterized.

To enable the following analysis on these special cases, it is assumed that $P_{x_1 x_2}(x_1, x_2)>0$ for every $(x_1, x_2) \in X_1 \times X_2$. Under this assumption, $V(X_1, X_2)=0$ if and only if $V(X_1|X_2)=V(X_2|X_1)=0$. As a result, the three cases discussed in Section A reduce to only two possible scenarios:

1) $V(X_1, X_2)=V(X_1|X_2)=V(X_2|X_1)=0$;
2) $V(X_1, X_2)>0$, and either $V(X_1|X_2)=0$ or $V(X_2|X_1)=0$.

Note that $X_1$ and $X_2$ are independent in both of these scenarios. The results are summarized below.

Special Case 1): Suppose that $V(X_1|X_2)=0$, $V(X_2|X_1)=0$, and $V(X_1, X_2)=0$. If $P_{x_1 x_2}$ satisfies $P_{x_1 x_2}(x_1, x_2)>0$ for every $(x_i, x_2) \in X_1 \times X_2$, then $$\mathscr{R}^*(n,\epsilon) = \mathscr{R}_{out}^{(1)}(n,\epsilon), \tag{89}$$

where $\mathscr{R}_{out}^{(1)}(n, \epsilon)$ is defined in (81).

Figure 11A:
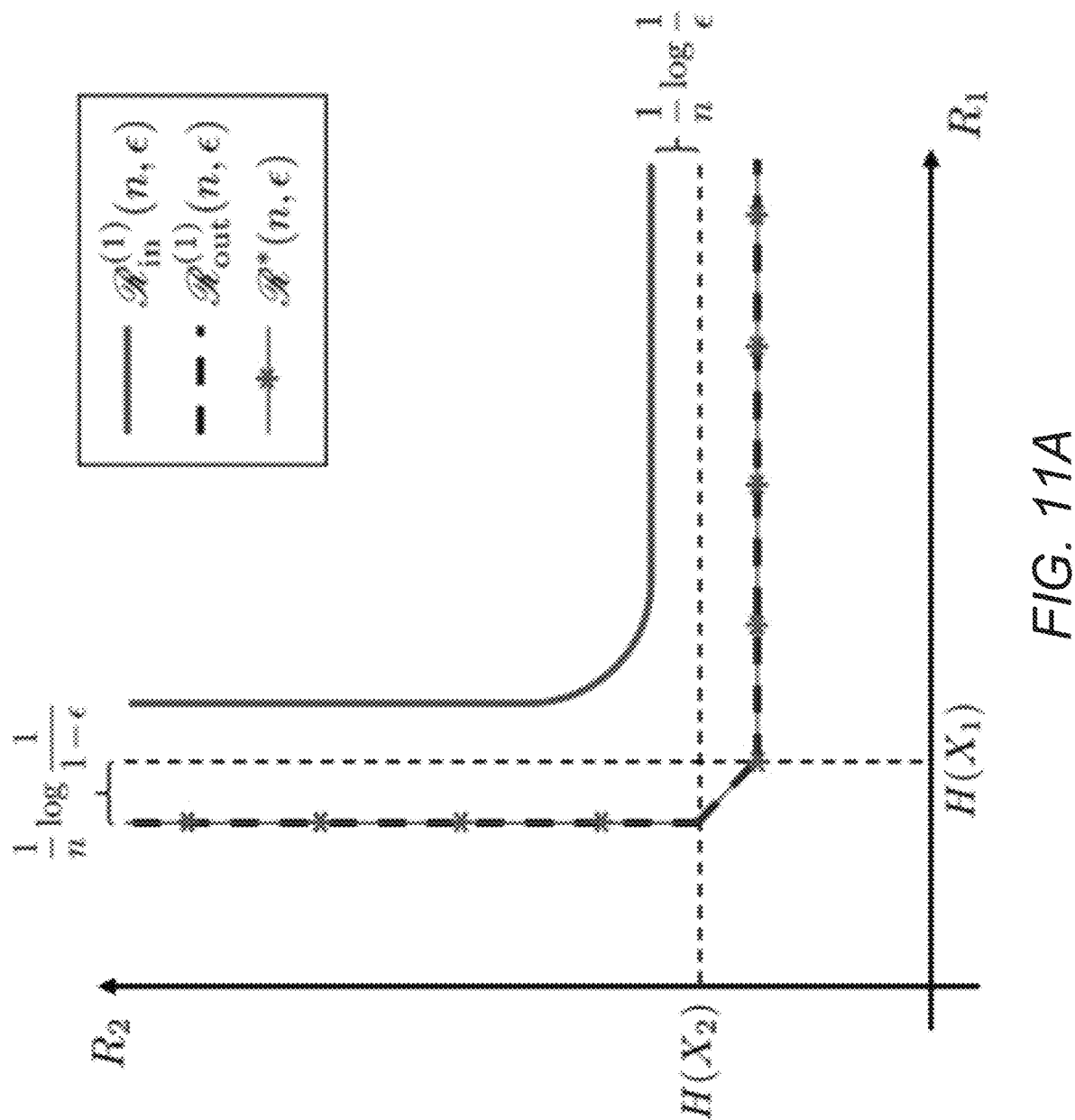
FIGS. 11A and 11B are schematic illustrations of the MASC rate regions for a less redundant source.
Figure 11B:
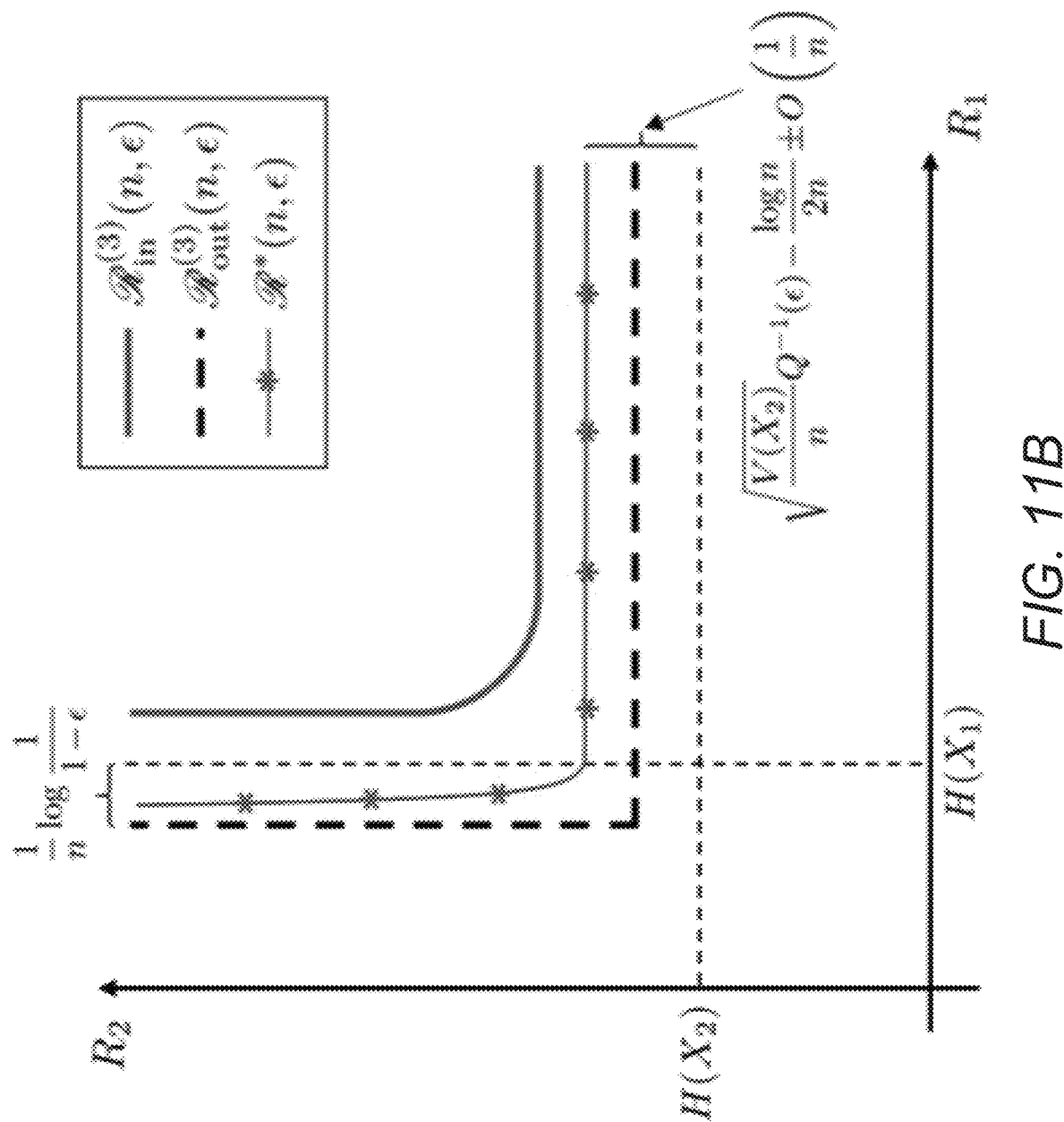

This scenario is a special example of Case 1) discussed in Section A above. The $(n, \epsilon)$-rate region here coincides with the converse region $\mathscr{R}_{out}^{(1)}(n, \epsilon)$ presented in (81) for general source distributions. See FIGS. 11A and 11B for a comparison among $\mathscr{R}_{in}^{(1)}(n, \epsilon)$, $\mathscr{R}_{out}^{(1)}(n, \epsilon)$, and $\mathscr{R}^*(n, \epsilon)$ in this special case. FIGS. 11A and 11B are schematic illustrations of the MASC rate regions for a less redundant source. The drawing in FIG. 11A illustrates the achievable and converse regions in Case 1) $(V(X_1, X_2)=V(X_1|X_2)=V(X_2|X_1)=0)$ and the $(n, \epsilon)$-rate region $\mathscr{R}^*(n, \epsilon)$ when $P_{x_1 x_2}$ is assumed to have no zeros (Special Case 1)). The drawing in FIG. 11B illustrates the achievable and converse regions in Case 3) $(V(X_1|X_2)=0, V(X_1, X_2), V(X_2|X_1)>0)$ and the $(n, \epsilon)$-rate region $\mathscr{R}^*(n, \epsilon)$ when $P_{x_1 x_2}$ is assumed to have no zeros (Special Case 2)).

Special Case 2): With $V(X_1, X_2)>0$, it can be assumed that $V(X_1|X_2)=0$ and $V(X_2|X_1)>0$. The other case can be analyzed similarly. For any $\delta \in [0, \epsilon)$, the following can be defined $$\hat{\mathscr{R}}_{in}^s(n,\delta) \triangleq \{(R_1, R_2) \in \mathbb{R}^2 : \tag{90}$$

$$R_1 \geq H(X_1) - \frac{1}{n}\log\frac{1}{1-\delta}$$

-continued $$R_2 \geq H(X_2) + \sqrt{\frac{V(X_2)}{n}} Q^{-1}\left(\frac{\epsilon - \delta}{1 - \delta}\right) - \frac{\log n}{2n} + \xi_{in}(\epsilon,\delta,n)\bigg\}$$

$$\hat{\mathcal{R}}^s_{out}(n,\delta) \triangleq \{(R_1, R_2) \in \mathbb{R}^2 : \quad (91)$$

$$R_1 \geq H(X_1) - \frac{1}{n}\log\frac{1}{1-\delta}$$

$$R_2 \geq H(X_2) + \sqrt{\frac{V(X_2)}{n}} Q^{-1}\left(\frac{\epsilon - \delta}{1 - \delta}\right) - \frac{\log n}{2n} - \xi_{out}(\epsilon,\delta,n)\bigg\},$$

where the functions $\xi_{in}(\epsilon, \delta, n)$ and $\xi_{out}(\epsilon, \delta, n)$ are characterized as follows. For any fixed $\delta$, $$\xi_{out}(\epsilon,\delta,n) = O\left(\frac{1}{n}\right) \text{ and } \xi_{in}(\epsilon,\delta,n) = O\left(\frac{1}{n}\right).$$

For any fixed n, both $\xi_{out}(\epsilon, \delta, n)$ and $\xi_{in}(\epsilon, \delta, n)$ blow up as $\delta$ approaches $\epsilon$.

Also the following can be defined $$\mathcal{R}^s_{in}(n,\epsilon) \triangleq \bigcup_{\delta \in [0,\epsilon)} \hat{\mathcal{R}}^s_{in}(n,\delta) \quad (92)$$

$$\mathcal{R}^s_{out}(n,\epsilon) \triangleq \bigcup_{\delta \in [0,\epsilon)} \hat{\mathcal{R}}^s_{out}(n,\delta). \quad (93)$$

Suppose that $V(X_1|X_2)=0$, $V(X_2|X_1)>0$, and $V(X_1, X_2)>0$. If $P_{X_1 X_2}$ satisfies $P_{X_1 X_2}(x_1, x_2)>0$ for every $(x_1, x_2) \in X_1 \times X_2$, then $$\mathcal{R}_{in}^s(n,\epsilon) \subseteq \mathcal{R}^*(n,\epsilon) \subseteq \mathcal{R}_{out}^s(n,\epsilon). \quad (94)$$

This scenario is a special example of Case 3) discussed in Section A above. The achievable region is $$\mathcal{R}^{(3)}_{in}(n,\epsilon) = \bigcup_{\delta \in (0,\epsilon)} \{(R_1, R_2) \in \mathbb{R}^2 : \quad (95)$$

$$R_1 \geq H(X_1) + \frac{1}{n}\log\frac{1}{\delta}$$

$$R_2 \geq H(X_2) + \sqrt{\frac{V(X_2)}{n}} Q^{-1}\left(\epsilon - \delta - \frac{C_{in}}{\sqrt{n}}\right) - \frac{\log n}{2n} + \frac{1}{n}\log\frac{1}{1-\delta}\bigg\},$$

and the converse region is $$\mathcal{R}^{(3)}_{out}(n,\epsilon) = \{(R_1, R_2) \in \mathbb{R}^2 : \quad (96)$$

$$R_1 \geq H(X_1) - \frac{1}{n}\log\frac{1}{1-\epsilon}$$

$$R_2 \geq H(X_2) + \sqrt{\frac{V(X_2)}{n}} Q^{-1}(\epsilon) - \frac{\log n}{2n} - O\left(\frac{1}{n}\right)\bigg\}.$$

As $\delta$ approaches $\epsilon$, the boundary of the (n, $\epsilon$)-rate region given in (92) approaches the line $$R_1 = H(X_1) - \frac{1}{n}\log\frac{1}{1-\epsilon},$$

which matches the vertical segment of the boundary of the converse region $\mathcal{R}_{out}^{(3)}(n, \epsilon)$. See FIG. 11B for a comparison of $\mathcal{R}_{in}^{(3)}(n, \epsilon)$, $\mathcal{R}_{out}^{(3)}(n, \epsilon)$, and $\mathcal{R}^*(n, \epsilon)$ in this case.

Although the present invention has been described in certain specific aspects, many additional modifications and variations would be apparent to those skilled in the art. It is therefore to be understood that the present invention can be practiced otherwise than specifically described including using any of a variety of different decoders and/or sources without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A random access source coding (RASC) system, comprising:
    a plurality of source encoders that are each configured to receive data from one of a plurality of sources;
        wherein each source encoder includes a transmitter, a receiver, a processor, and an encoder; and
        wherein, when a source encoder of the plurality of source encoders receives data from one of the plurality of sources, the processor of the source encoder is configured to:
            receive, through the receiver of the source encoder, a start of epoch message; and
            transmit, using the transmitter of the source encoder, a portion of a codeword, selected by the encoder source encoding data from one of the plurality of sources to remove redundancy, until an end of epoch feedback message is received through the receiver of the source encoder, wherein the source encoding is performed using at least one of:
                a communication style selected from the group consisting of point-to-point communication, multiple access communication, and random access communication; and
                a family of codes indexed using common randomness; and
    a source decoder,
        wherein the source decoder includes a transmitter, a receiver, a processor, and a decoder; and
        wherein the processor of the source decoder is configured to:
            transmit, using the transmitter of the source decoder, at least one start of epoch message;
            receive, using the receiver of the source decoder, at least one portion of a codeword transmitted by the transmitter of at least one of the plurality of source encoders; and
            determine, through the decoder, whether a decoding rule is satisfied at each of a predetermined set of decode times,
                wherein each of the predetermined set of decode times corresponds to one of a plurality of blocklengths of the codeword, and
                wherein at least one blocklength of the plurality of blocklengths is a prefix to another blocklength of the plurality of blocklengths; and
            when the decoding rule is satisfied,
                source decode, using the decoder, data from the at least one of the plurality of source encoders based upon the received at least one portion of a codeword, wherein the source decoding is performed using at least one of:
                    the communication style; and
                    the family of codes indexed using common randomness; and transmit, using the transmitter of the source decoder, an end of epoch message.

2. The RASC system of claim 1, wherein:
based on whether the decoding rule is satisfied at each of the predetermined set of decode times, the source decoder is configured to transmit, through the transmitter of the source decoder, a feedback message; and
each of the plurality of source encoders is configured to receive, through their receiver, feedback messages at each of the predetermined set of decode times;
each of the plurality of blocklengths of the codeword is selected by the encoder source encoding data, from one of the plurality of sources to remove redundancy.

3. The RASC system of claim 2, wherein:
a first of the plurality of blocklengths of the codeword, selected by the encoder source encoding data from one of the plurality of sources to remove redundancy, forms a first blocklength code;
a second of the plurality of blocklengths of the codeword, selected by the encoder source encoding data from one of the plurality of sources to remove redundancy, forms a second blocklength code; and
the first blocklength code forms a prefix for the second blocklength code.

4. The RASC system of claim 3, wherein:
a third of the plurality of blocklengths of the codeword, selected by the encoder source encoding data from one of the plurality of sources to remove redundancy, forms a third blocklength code; and
the second blocklength code forms a prefix for the third blocklength code.

5. The RASC system of claim 1, wherein the processor of each source encoder is configured to select codewords from a codebook.

6. The RASC system of claim 1, wherein the data received from the plurality of sources is dependent.

7. The RASC system of claim 1, wherein the source decoder transmits a negative acknowledgement feedback message when the decoding rule is not satisfied at a predetermined decode time.

8. The RASC system of claim 1, wherein each source encoder is configured to transmit, through their transmitter, an additional portion of the codeword, selected by the encoder source encoding data from one of the plurality of sources to remove redundancy, in response to receipt of a negative acknowledgement feedback message.

9. A source encoding process, executable by at least one processor, the process comprising:
receiving a start of epoch message; and
transmitting a portion of a codeword, selected by source encoding data from a source to remove redundancy, until an end of epoch feedback message is received, wherein:
the source encoding is performed using at least one of:
a communication style selected from the group consisting of point-to-point communication, multiple access communication, and random access communication; and
a family of codes indexed using common randomness;
each of a predetermined set of decode times corresponds to one of a plurality of blocklengths of the codeword; and
at least one blocklength of the plurality of blocklengths is a prefix to another blocklength of the plurality of blocklengths.

10. The source encoding process of claim 9, further comprising:
receiving feedback messages at each of the predetermined set of decode times; and
each of the plurality of blocklengths of the codeword is selected by source encoding data to remove redundancy, from the source.

11. The source encoding process of claim 10, wherein:
a first of the plurality of blocklengths of the codeword, selected by source encoding data from the source to remove redundancy, forms a first blocklength code;
a second of the plurality of blocklengths of the codeword, selected by source encoding data from the source to remove redundancy, forms a second blocklength code; and
the first blocklength code forms a prefix for the second blocklength code.

12. The source encoding process of claim 11, wherein:
a third of the plurality of blocklengths of the codeword, selected by source encoding data from the source to remove redundancy, forms a third blocklength code; and
the second blocklength code forms a prefix for the third blocklength code.

13. The source encoding process of claim 9, further comprising transmitting an additional portion of the codeword, selected by source encoding data from the source to remove redundancy, in response to receipt of a negative acknowledgement feedback message.

14. The source encoding process of claim 9, wherein the data received from the source is dependent.

15. The source encoding process of claim 9, wherein the codeword is selected from a codebook.

16. A source decoding process, executable by at least one processor, the process comprising:
transmitting at least one start of epoch message;
receiving at least one portion of a codeword;
determining when a decoding rule is satisfied at each of a predetermined set of decode times,
wherein each of the predetermined set of decode times corresponds to one of a plurality of blocklengths of the codeword; and
wherein at least one blocklength of the plurality of blocklengths is a prefix to another blocklength of the plurality of blocklengths; and
when the decoding rule is satisfied:
source decoding at least one message based upon the received at least one portion of a codeword using a codebook, wherein the source decoding is performed using at least one of:
a communication style selected from the group consisting of point-to-point communication, multiple access communication, and random access communication; and
a family of codes indexed using common randomness; and
transmitting an end of epoch message.

17. The source decoding process of claim 16, further comprising,
based on whether the decoding rule is satisfied at each of the predetermined set of decode times, transmitting a feedback message.

18. The source decoding process of claim 17, wherein:
a first of the plurality of blocklengths of the codeword forms a first blocklength code;
a second of the plurality of blocklengths of the codeword forms a second blocklength code; and the first blocklength code forms a prefix for the second blocklength code.

19. The source decoding process of claim 18, wherein:
a third of the plurality of blocklengths of the codeword forms a third blocklength code; and
the second blocklength code forms a prefix for the third blocklength code.

20. The source decoding process of claim 16, further comprising transmitting a negative acknowledgement feedback message when the decoding rule is not satisfied at a predetermined decode time.

21. The source decoding process of claim 16, wherein the codeword is selected from a codebook.

22. The source decoding process of claim 16, further comprising transmitting a negative acknowledgement feedback message when the decoding rule is not satisfied at a predetermined decode time.

* * * * *